US008921834B2

(12) United States Patent
Tomono et al.

(10) Patent No.: US 8,921,834 B2
(45) Date of Patent: Dec. 30, 2014

(54) ORGANIC LIGHT-EMITTING DEVICE

(75) Inventors: Hiroyuki Tomono, Numazu (JP); Kengo Kishino, Tokyo (JP); Masashi Hashimoto, Tokyo (JP); Yuko Chishina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 197 days.

(21) Appl. No.: 13/395,875

(22) PCT Filed: Sep. 21, 2010

(86) PCT No.: PCT/JP2010/005725

§ 371 (c)(1), (2), (4) Date: Mar. 13, 2012

(87) PCT Pub. No.: WO2011/036868

PCT Pub. Date: Mar. 31, 2011

(65) Prior Publication Data

US 2012/0168737 A1 Jul. 5, 2012

(30) Foreign Application Priority Data

Sep. 24, 2009 (JP) ................................ 2009-219063

(51) Int. Cl.
*H01L 51/54* (2006.01)
*C09K 11/06* (2006.01)
*H01L 51/50* (2006.01)
*H05B 33/14* (2006.01)

(52) U.S. Cl.
CPC ....... *H01L 51/5012* (2013.01); *H01L 2251/552* (2013.01); *C09K 11/06* (2013.01); *C09K 2211/1011* (2013.01); *H05B 33/14* (2013.01)
USPC .................................... 257/40; 257/E51.026

(58) Field of Classification Search
None
See application file for complete search history.

(56) References Cited

U.S. PATENT DOCUMENTS

2006/0043859 A1* 3/2006 Fukuoka et al. .............. 313/250
2007/0247061 A1* 10/2007 Adamovich et al. .......... 313/504
2008/0265763 A1* 10/2008 Furugori et al. .............. 313/504

FOREIGN PATENT DOCUMENTS

JP 2005-108726 A 4/2005
JP 2005-108727 A 4/2005
JP 2006-073640 A 3/2006
JP 2006-156888 A 6/2006
JP 2007-011063 A 1/2007
JP 2007-012946 A 1/2007
WO 2009-008348 A1 1/2009

OTHER PUBLICATIONS

Hiroshi Kanno et al. "White organic light-emitting device based on a compound fluorescent-phosphor-sensitized fluorescent emmission layer", Applied Physics Letters, vol. 89, No. 143516, 2006, pp. 1-3.

* cited by examiner

*Primary Examiner* — Fernando L Toledo
*Assistant Examiner* — Valerie N Newton
(74) *Attorney, Agent, or Firm* — Canon USA, Inc. IP Division

(57) ABSTRACT

An organic light-emitting device includes an anode, a cathode, and an organic compound layer including at least a light-emitting sublayer and being arranged between the anode and the cathode, the light-emitting sublayer containing a host serving as a main component, a first dopant, and a second dopant, in which for the host, the first dopant, and the second dopant, the following relationships (a) to (c) hold, whereby only the second dopant emits light:

(a) first maximum emission wavelength (H)<first maximum emission wavelength (D1)<first maximum emission wavelength (D2), (b) LUMO (D2)<LUMO (D1)<LUMO (H), and (c) HOMO (D2) is equal to or lower than HOMO (H)<HOMO (D1).

8 Claims, 4 Drawing Sheets

ORGANIC LIGHT-EMITTING DEVICE

TECHNICAL FIELD

The present invention relates to an organic light-emitting device.

BACKGROUND ART

An organic light-emitting device includes a thin film containing a light-emitting organic compound, the thin film being arranged between an anode and a cathode. Excitons of the light-emitting compound are formed by injecting electrons and holes from the electrodes. When the excitons return to the ground state, the organic light-emitting device emits light.

Recently, organic light-emitting devices have greatly improved. The characteristic features of organic light-emitting devices include high luminance at a low applied voltage, a variety of emission wavelengths, rapid response, and the fact that thin, lightweight light-emitting devices can be produced. Thus, organic light-emitting devices can be potentially used for a wide variety of applications.

However, there is still room for improvement in the present circumstances. Specifically, in order to achieve practical use, organic light-emitting devices are required to have a higher-intensity optical output or higher photoconversion efficiency. Furthermore, it is necessary to minimize the variation with time by prolonged use and to improve durability, for example, the resistance to degradation due to an oxygen-containing atmosphere, humidity, and so forth.

A technique for adding a small quantity of light-emitting molecules (dopant) to an organic light-emitting layer mainly composed of a host has been known. This technique is very important in the improvement of the luminous efficiency and emission lifetime of an organic light-emitting device. Various improvements have been made.

Furthermore, a technique for incorporating a dopant that functions of transporting carriers or transferring excitation energy in addition to a dopant serving as light-emitting molecules into a light-emitting layer has been known as the related art.

Among these techniques, a technique for confining charges in a light-emitting layer by trapping carriers injected in the layer by a dopant has been reported. For example, an organic light-emitting device including a luminous layer that contains a hole-trapping material and an electron-trapping material is disclosed (see PTL 1).

For the organic light-emitting device disclosed in PTL 1, holes and electrons are accumulated in the hole-trapping material and the electron-trapping material, respectively, contained in the light-emitting layer. Thereby, the hole-trapping material or the electron-trapping material emits light. With respect to the materials in which charges are accumulated, however, the occurrence of quenching due to the reaction of accumulated charges with excitons during the emission of light from the materials can result in the formation of charges that do not contribute to light emission. Furthermore, the hole-trapping material disclosed in PTL 1 contains a nitrogen atom and thus does not easily serve as a charge transporter for electrons in the light-emitting layer. As a result, the carrier balance tends to be poor. In addition, the hole-trapping material disclosed in PTL 1 easily forms a charge-transfer complex, possibly causing reductions in luminous efficiency and emission lifetime. There is a possibility that even if the hole-trapping material disclosed in PTL 1 is used in a low concentration in order to inhibit the formation of the charge-transfer complex, insufficient hole-trapping properties and hole injection properties are obtained.

CITATION LIST

Patent Literature

PTL 1: Japanese Patent Laid-Open No. 2006-156888

SUMMARY OF INVENTION

The present invention has been made in order to overcome the foregoing problems. The present invention provides an organic light-emitting device that can be driven at a low voltage and has satisfactory luminous efficiency and a long lifetime under continuous operation.

The present invention provides an organic light-emitting device including an anode, a cathode, and an organic compound layer including at least a light-emitting sublayer and being arranged between the anode and the cathode, the light-emitting sublayer containing a host serving as a main component, a first dopant, and a second dopant, the organic light-emitting device satisfying the following relationships (1) and (2):

(1) LUMO (H)>LUMO (D2), and (2) HOMO (H) is equal to or higher than HOMO (D2), (where LUMO (H) represents the LUMO of the host, LUMO (D2) represents the LUMO of the second dopant, HOMO (H) represents the HOMO of the host, and HOMO (D2) represents the HOMO of the second dopant), in which for the host, the first dopant, and the second dopant, the following relationships (a) to (c) hold, whereby only the second dopant emits light:

(a) first maximum emission wavelength (H)<first maximum emission wavelength (D1)<first maximum emission wavelength (D2), (b) LUMO (D2)<LUMO (D1)<LUMO (H), and (c) HOMO (D2) is equal to or lower than HOMO (H)<HOMO (D1)

(where in the relationship (a), the first maximum emission wavelength (H) indicates the first maximum emission wavelength of the host, the first maximum emission wavelength (D1) indicates the first maximum emission wavelength of the first dopant, and the first maximum emission wavelength (D2) indicates the first maximum emission wavelength of the second dopant; in the relationship (b), LUMO (H) represents the LUMO of the host, LUMO (D1) represents the LUMO of the first dopant, and LUMO (D2) represents the LUMO of the second dopant; and in the relationship (c), HOMO (H) and HOMO (D2) are as defined above, and HOMO (D1) represents the HOMO of the first dopant).

DESCRIPTION OF EMBODIMENTS

Figure 1A:
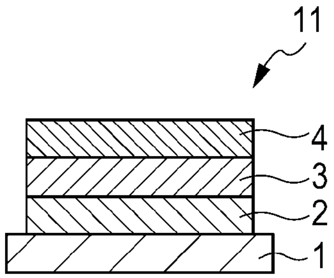
FIG. 1A is a schematic cross-sectional view of an organic light-emitting device according to an embodiment of the present invention.

An organic light-emitting device according to aspects of the present invention includes an anode, a cathode, and an organic compound layer which is arranged between the anode and the cathode and which includes at least a light-emitting sublayer.

The organic light-emitting device according to aspects of the present invention will be described below with reference to the attached drawings.

First, reference numerals in the drawings will be described.

Reference numeral 1 denotes a substrate. Reference numeral 2 denotes an anode. Reference numeral 3 denotes a light-emitting sublayer. Reference numeral 4 denotes a cathode. Reference numeral 5 denotes a hole transport layer. Reference numeral 6 denotes an electron transport layer. Reference numeral 7 denotes a hole injection layer. Reference numeral 8 denotes a hole/exciton blocking layer. Reference numeral 9 denotes an electron injection layer. Reference numerals 11, 12, 13, 14, 15, 16, and 17 denote organic light-emitting devices. Reference numeral 20 denotes a display. Reference numeral 21 denotes a TFT driving circuit. Reference numeral 22 denotes a planarized film. Reference numeral 23 denotes a reflective film. Reference numeral 24 denotes a transparent electrode. Reference numeral 25 denotes a pixel separation film. Reference numeral 26 a glass cap. Reference numeral 27 denotes a drying agent. Reference numeral 28 denotes a circularly polarizing plate. Reference numeral 31 denotes a blue-light-emitting layer. Reference numeral 32 denotes a green-light-emitting layer. Reference numeral 33 denotes a red-light-emitting layer.

FIGS. 1A to 1G are schematic cross-sectional views of an embodiment of the present invention. FIGS. 1A to 1G are organic light-emitting devices according to first to seventh embodiments, respectively, of the present invention.

For the organic light-emitting device 11 illustrated in FIG. 1A, the anode 2, the light-emitting sublayer 3, and the cathode 4 are stacked, in that order, on the substrate 1. The organic light-emitting device 11 illustrated in FIG. 1A is useful when the light-emitting sublayer 3 has all the capabilities of transporting holes and electrons and emitting light. The organic light-emitting device 11 illustrated in FIG. 1A is also useful when the light-emitting sublayer 3 contains a hole transport material, an electron transport material, and a light-emitting material.

Figure 1B:
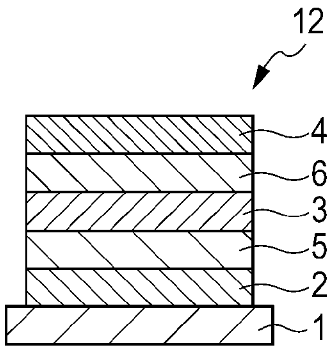
FIG. 1B is a schematic cross-sectional view of an organic light-emitting device according to an embodiment of the present invention.

For the organic light-emitting device 12 illustrated in FIG. 1B, the anode 2, the hole transport layer 5, the light-emitting sublayer 3, the electron transport layer 6, and the cathode 4 are stacked, in that order, on the substrate 1. In the case of the organic light-emitting device 12 illustrated in FIG. 1B, the layers having the function of transporting carriers are separated from the layer having the function of emitting light. So, the layers can be used in appropriate combination with compounds having the capabilities of transporting holes and electrons and emitting light. This enables us to have extremely high flexibility in the choice of materials and to effectively confine carriers or excitons to the medial light-emitting sublayer 3, improving the luminous efficiency.

Figure 1C:
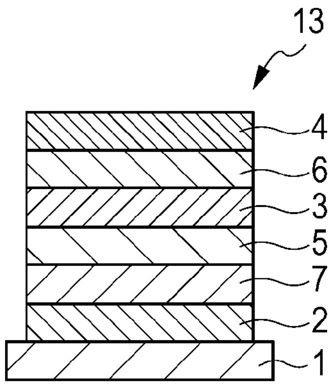
FIG. 1C is a schematic cross-sectional view of an organic light-emitting device according to an embodiment of the present invention.

For the organic light-emitting device 13 illustrated in FIG. 1C, the hole injection layer 7 is interposed between the anode 2 and the hole transport layer 5 of the organic light-emitting device 12 illustrated in FIG. 1B. The arrangement of the hole injection layer 7 improves the hole injection properties and the adhesiveness between the anode 2 and the hole transport layer 5 and is thus effective in reducing the voltage.

Figure 1D:
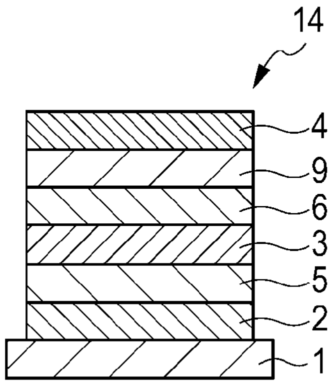
FIG. 1D is a schematic cross-sectional view of an organic light-emitting device according to an embodiment of the present invention.

For the organic light-emitting device 14 illustrated in FIG. 1D, the electron injection layer 9 is interposed between the electron transport layer 6 and the cathode 4 of the organic light-emitting device 12 illustrated in FIG. 1B. The formation of the electron injection layer 9 improves the electron injection properties and the adhesiveness between the cathode 4 and the electron transport layer 6 and is thus effective in reducing the voltage.

Figure 1E:
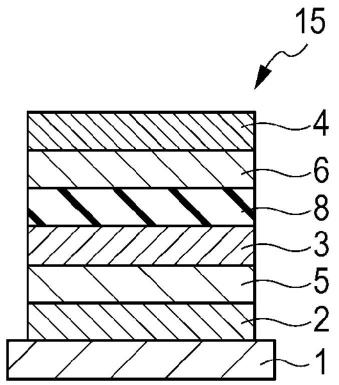
FIG. 1E is a schematic cross-sectional view of an organic light-emitting device according to an embodiment of the present invention.

For the organic light-emitting device 15 illustrated in FIG. 1E, a layer (hole/exciton blocking layer 8) configured to inhibit the transfer of excitons toward the cathode 4 is interposed between the light-emitting sublayer 3 and the electron transport layer 6 of the organic light-emitting device 12 illustrated in FIG. 1B. In particular, the incorporation of a compound with a very low HOMO energy level into the hole/exciton blocking layer 8 is effective in improving the luminous efficiency.

Figure 1F:
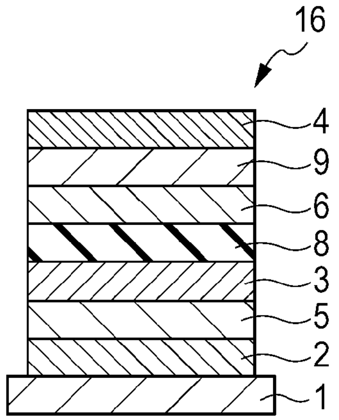
FIG. 1F is a schematic cross-sectional view of an organic light-emitting device according to an embodiment of the present invention.

For the organic light-emitting device 16 illustrated in FIG. 1F, the electron injection layer 9 is interposed between the electron transport layer 6 and the cathode 4 of the organic light-emitting device 14 illustrated in FIG. 1E. The formation of the electron injection layer 9 improves the electron injection properties and the adhesiveness between the cathode 4 and the electron transport layer 6 and is thus effective in reducing the voltage.

Figure 1G:
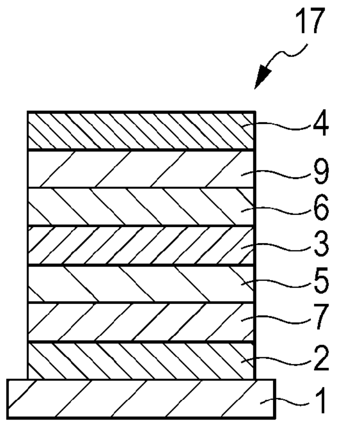
FIG. 1G is a schematic cross-sectional view of an organic light-emitting device according to an embodiment of the present invention.

For the organic light-emitting device 17 illustrated in FIG. 1G, the electron injection layer 9 is interposed between the electron transport layer 6 and the cathode 4 of the organic light-emitting device 13 illustrated in FIG. 1C. The formation of the electron injection layer 9 improves the electron injection properties and the adhesiveness between the cathode 4 and the electron transport layer 6 and is thus effective in reducing the voltage.

However, the organic light-emitting devices illustrated in FIGS. 1A to 1G have very basic device structures. The present invention is not limited thereto. Various layer structures may be used. Examples of the layer structures include a structure in which an insulating layer, an adhesive layer, or an interference layer is arranged at the interface between one electrode and the organic compound layer; and a structure in which the hole transport layer is formed of two sublayers having different HOMO energy levels.

In aspects of the present invention, the light-emitting sublayer included in the device contains a host, a first dopant, and a second dopant. Among these materials, only the second dopant emits light. Furthermore, in the host, the first dopant, and the second dopant, the following relationships (1) and (2) hold:

(1) LUMO (H)>LUMO (D2) and (2) HOMO (H) is equal to or higher than HOMO (D2).

In aspects of the present invention, the term "light-emitting sublayer" indicates a sublayer which has the function of emitting light and which is included in the organic compound layer arranged between the electrodes. The term "host" contained in the light-emitting sublayer indicates a main component of the light-emitting sublayer among components contained in the light-emitting sublayer. Specifically, the term "main component" used here indicates a component in which the proportion thereof in the light-emitting sublayer is 50% by weight or more. Thus, the total proportion of the two dopants (first and second dopants) in the light-emitting sublayer is less than 50% by weight. An excessively high concentration of the light-emitting material can cause a reduction in efficiency due to concentration quenching. Thus, the proportion of the second dopant, which is a light-emitting material, in the light-emitting sublayer is preferably 20% by weight or less and more preferably 10% by weight or less. Specific examples of the host, the first dopant, and the second dopant will be described below.

According to aspects of the present invention, in the host, the first dopant, and the second dopant contained in the light-emitting sublayer, the following relationships (a) to (c) hold:

(a) first maximum emission wavelength (H)<first maximum emission wavelength (D1)<first maximum emission wavelength (D2), (b) LUMO (D2)<LUMO (D1)<LUMO (H), and (c) HOMO (D2) is equal to or lower than HOMO (H)<HOMO (D1).

In the case described above, the host has the function of conducting charges in the light-emitting sublayer, and the second dopant that is stable toward oxidation and reduction emits light. Furthermore, the incorporation of the first dopant that satisfies the relationships (a) to (c) facilitates the injection of holes into the light-emitting sublayer and delocalizes some electrons accumulated in the second dopant. Moreover, the incorporation of the first dopant that satisfies the relationships (a) to (c) efficiently transports the excitation energy into the second dopant. The details will be described below.

First, the relationship (a) will be described. In the relationship (a), the first maximum emission wavelength (H), the first maximum emission wavelength (D1), and the first maximum emission wavelength (D2) indicate first maximum emission wavelengths of the host, the first dopant, and the second dopant, respectively.

The term "first maximum emission wavelength" used here indicates the wavelength of the shortest wavelength peak among peaks in an emission spectrum. When the relationship (a) holds, it is possible to transfer the energy of the host in an excited state to the second dopant. Furthermore, it is possible to transfer the energy, such as excitation energy, of the first dopant to the second dopant. Thus, the emission of light with a wavelength other than a target emission wavelength is suppressed, thereby efficiently producing light with high color purity from the second dopant. It is also possible to suppress a change in emission color during high-temperature operation due to different dependencies of quantum yields of light-emitting materials on temperature. To emit light only from the second dopant, the materials may be selected in such a manner that the absorption wavelength range of the second dopant overlaps emission wavelength ranges of the host and the first dopant. This facilitates both of the energy transfer from the host to the second dopant and the energy transfer from the first dopant to the second dopant, thereby improving the luminous efficiency of the device. Furthermore, the use of the host and the second dopant together with the first dopant advantageously suppresses concentration quenching due to the association of the second dopant and improves film formability owing to the incorporation of the first dopant.

Next, the relationship (b) will be described. In the relationship (b), LUMO (H), LUMO (D1), and LUMO (D2) represent LUMOs of the host, the first dopant, and the second dopant, respectively.

Figure 2:
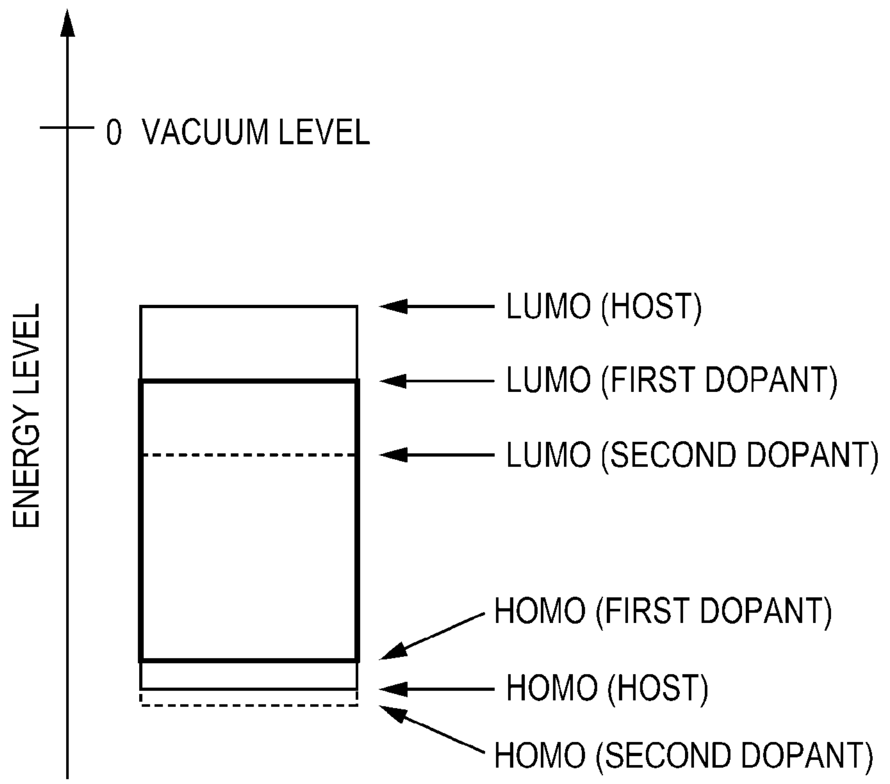
FIG. 2 is an energy diagram of an organic light-emitting device according to aspects of the present invention.

Here, a specific aspect of the relationships (b) and (c) will be described with reference to the attached drawing. FIG. 2 illustrates a specific example of an energy diagram of an organic light-emitting device according to aspects of the present invention. The energy diagram of FIG. 2 illustrates the LUMO (lowest unoccupied molecular orbital) level and the HOMO (highest occupied molecular orbital) level of a host material, the LUMO level and the HOMO level of the first dopant, and the LUMO level and the HOMO level of the second dopant with respect to the vacuum level. Note that in FIG. 2, the HOMO level and the LUMO level are negative values.

In aspects of the present invention, when the relationship (b) holds, the LUMO of the second dopant has the lowest energy level in the light-emitting sublayer. This means that the second dopant, which is a light-emitting material, has the lowest reduction potential. Here, the fact that the reduction potential is lowered means that a higher energy is required to reduce the second dopant. That is, in aspects of the present invention, the second dopant, which is a light-emitting material, is the most stable to reduction by electrons. Although the cause of the degradation of luminous characteristics of organic light-emitting devices due to energization is not clear so far, the degradation may be associated with the change of light-emitting materials. The light-emitting material described above is stable to the reduction by electrons, thus suppressing the change of the light-emitting material contained in the organic light-emitting device due to the reduction by electrons during energization. It is thus possible to suppress the degradation of the luminous characteristics of the organic light-emitting device. Furthermore, electrons injected into the light-emitting sublayer are trapped in the second dopant, resulting in a reduction in electron mobility. This makes it possible to recombine holes with electrons in the vicinity of the electron transport layer. Furthermore, when the relationship (b) holds, it is possible to advantageously inhibit the change of the state of a material (hole transport material) for the hole transport layer into an unstable anionic state due to the transfer of electrons injected into the light-emitting sublayer to the hole transport layer. It is thus possible to suppress the degradation of the hole transport layer and the interface between the hole transport layer and the light-emitting sublayer of the organic light-emitting device due to energization. Meanwhile, the accumulation of electrons in the second dopant having the function of emitting light are liable to cause deactivation of excitons and quenching due to the deactivation. At this point, in aspects of the present invention, in order to satisfy the relationship (b), some electrons injected into the light-emitting sublayer are trapped in the first dopant, thus suppressing the quenching by electrons injected into the light-emitting sublayer during the emission of light from the second dopant.

To further reduce the electron mobility in the light-emitting sublayer, with respect to the host and the second dopant, preferably, the following relationship (b1) holds:

(b1) |LUMO (D2)−LUMO (H)| is equal to or higher than 0.1 eV.

More preferably, with respect to the host and the second dopant, the following relationship (b2) holds:

(b2) |LUMO (D2)−LUMO (H)| is equal to or higher than 0.4 eV.

A mechanism when the above-described relationship holds will be discussed.

Electrons injected into the host are trapped in the first dopant or the second dopant that have lower energy levels. However, the light-emitting sublayer is mainly composed of the host. Thus, the host forms a main conduction level in the light-emitting sublayer, so that some trapped electrons return to the host and conduct in the light-emitting sublayer. Hence, a larger value of |LUMO (D2)−LUMO (H)| results in a lower electron mobility. Accordingly, as expressed in the relationship (b) and illustrated in FIG. 2, the LUMO energy level of the first dopant is set between energy levels of the LUMO of the host and the LUMO of the second dopant. This makes it possible to suppress the accumulation of electrons in the second dopant, which is a light-emitting material, and prevent quenching of excitons attributed to the excess amount of electrons accumulated in the second dopant.

In aspects of the present invention, with respect to the host, the first dopant, and the second dopant, the following relationships (b3) and (b4) may hold:

(b3) |LUMO (D1)−LUMO (D2)| is equal to or higher than 0.1 eV, and (b4) |LUMO (D1)−LUMO (H)| is equal to or higher than 0.1 eV.

In the case where the relationship (b3) does not hold, the LUMO of the first dopant is excessively close to the LUMO of the second dopant, facilitating the transfer of electrons between the first dopant and the second dopant. So, electrons are easily accumulated in the second dopant. In other words, electrons are not easily accumulated in the first dopant. In the case where the relationship (b4) does not hold, the LUMO of the host is excessively close to the LUMO of the first dopant, facilitating the transfer of electrons between the host and the first dopant. As a result, the purpose of accumulating electrons in the first dopant and the second dopant is not achieved.

While an exemplary configuration is described below, the present invention is not limited to the exemplary configuration.

For example, when |LUMO (H)−LUMO (D2)|=0.6 eV, with respect to LUMO (D1) and LUMO (D2), the following relationship (b5) may hold in such a manner that the relationship (b3) holds:

(b5) |LUMO (D1)−LUMO (D2)| is in the range of 0.1 eV to 0.5 eV.

In the case where the relationship (b5) holds and where |LUMO (D1)−LUMO (D2)| is about 0.1 eV, the light-emitting sublayer may have a lower first dopant content. The reason for this is as follows: A lower value of |LUMO (D1)−LUMO (D2)| results in a smaller energy difference, which is a barrier when electrons conduct between the first dopant and the second dopant. Thus, electrons can conduct easily between the first dopant and the second dopant even at a low first dopant content. Meanwhile, in the case where the relationship (b5) holds and where |LUMO (D1)−LUMO (D2)| is about 0.5 eV, the light-emitting sublayer may have a higher first dopant content. The reason for this is as follows: A higher value of |LUMO (D1)−LUMO (D2)| results in a larger energy difference, which is a barrier when electrons conduct between the first dopant and the second dopant. It is thus necessary to increase the first dopant content to reduce the distance between the first dopant and the second dopant. As described above, a reduction in the distance between the first dopant and the second dopant facilitates the transfer of electrons between the first dopant and the second dopant.

In aspects of the present invention, the light-emitting sublayer has a host content of 50% by weight or more. Thus, each of the first dopant content and the second dopant content is less than 50% by weight. Here, let the second dopant content of the light-emitting sublayer is x % by weight. The relationship among the LUMO of the host, the LUMO of the first dopant, the LUMO of the second dopant, and the first dopant content is expressed as the following mathematical expression, and thus the first dopant content can be approximately estimated:

$$[\text{first dopant content (\% by weight)}]=(50-x)X|\text{LUMO}(D1)-\text{LUMO}(D2)|/|\text{LUMO}(H)-\text{LUMO}(D2)|.$$

(wherein, when LUMO (D1)=LUMO (H), the upper limit of the first dopant content is obtained (50−x (% by weight)); and when LUMO (D1)=LUMO (D2), the lower limit of the first dopant content is obtained (0% by weight)).

Here, in the case where |LUMO (H)−LUMO (D2)|=0.6 eV and where the light-emitting sublayer has a second dopant content of 5% by weight, the light-emitting sublayer preferably has a first dopant content of 7.5% to 37.5% by weight in view of the relationship (b5). Furthermore, as described below, the first dopant may have satisfactory hole injection properties. Thus, the light-emitting sublayer particularly preferably has a first dopant content of 10% by weight or more. Accordingly, particularly preferably, the following relationship (b6) may hold:

(b6) |LUMO (D1)−LUMO (D2)|>0.2 eV.

The relationship (c) will be described below. In the relationship (c), HOMO (H), HOMO (D1), and HOMO (D2) represent the HOMOs of the host, the first dopant, and the second dopant, respectively.

In aspects of the present invention, when the relationship (c) holds, holes injected from the anode can be conducted through the hole transport layer and then injected into the light-emitting sublayer. This increases the hole density in the light-emitting sublayer to allow the injected holes to recombine with electrons excessively accumulated in the light-emitting sublayer, so that the electrons are consumed. Furthermore, the driving voltage is reduced.

In the light-emitting sublayer, the first dopant has the highest HOMO energy level, so that holes are easily accumulated in the first dopant, thus suppressing the change of the state of the second dopant, which is a light-emitting material, into an unstable cationic state. This suppresses the degradation of the material and a reduction in luminance due to the formation of the cationic state.

Holes injected into the light-emitting sublayer recombine with electrons injected from the cathode to form excitons, thereby emitting light from the second dopant, which is a light-emitting material. Here, the recombination of holes and electrons may occur on molecules of the second dopant. Alternatively, the recombination may occur on molecules of the host or the first dopant. That is, the second dopant may ultimately emit light by forming excitons on the molecules of the host or the first dopant by the recombination of holes and electrons and then transferring the energy of the excitons to the second dopant, which is a light-emitting material. This inhibits a phenomenon such as quenching in which excitons are deactivated in the second dopant where electrons are easily accumulated, thus suppressing a reduction in luminous efficiency. Hence, after holes are accumulated in the first dopant in the light-emitting sublayer, the holes may recombine with electrons on the first dopant. Furthermore, it is possible to increase the number of excitons, thereby resulting in a low voltage and high luminous efficiency. Moreover, it is possible to efficiently emit light from the second dopant. This inhibits the degradation of the light-emitting material and suppresses a reduction in luminance under continuous operation.

In aspects of the present invention, the relationship "HOMO (H) is equal to or higher than HOMO (D2)" holds. That is, even if the host has a HOMO energy level comparable to that of the second dopant, holes are not easily accumulated in the second dopant because the light-emitting sublayer is mainly composed of the host. Here, the following relationship (c1) may hold:

(c1) HOMO (H)>HOMO (D2).

In the structure according to aspects of the present invention, it is necessary to overcome the energy bather in order to allow the second dopant to trap holes. Thus, the presence of the first dopant, which easily traps holes, inhibits the change of the state of the second dopant, which is a light-emitting material, into an unstable state and suppresses a reduction in luminance due to material degradation.

Specific examples of the host, the first dopant, and the second dopant will be described below.

In aspects of the present invention, the host is a compound that emits light with a shorter wavelength than those of the first dopant and the second dopant. Examples of the compound for the host include compounds having an anthracene skeleton, a pyrene skeleton, a fluorene skeleton, a fluoranthene skeleton, a benzofluoranthene skeleton, a tetracene skeleton, a triphenylene skeleton, and a chrysene skeleton. The host may be a compound having a pyrene skeleton. The reason for this is described below. In addition, the foregoing skeleton may have an aromatic hydrocarbon group or an alkyl group.

Non-limiting examples of the aromatic hydrocarbon group include phenyl, naphthyl, azulenyl, acenaphthylenyl, indacenyl, biphenylel, fluorenyl, anthracenyl, phenanthryl, pyrenyl, chrysenyl, benzofluorenyl, tetraphenyl, naphthacenyl, triphenylenyl, fluoranthenyl, picenyl, pentacenyl, perylenyl, and benzofluoranthenyl groups. Furthermore, the aromatic hydrocarbon group may further have a substituent, e.g., the foregoing aromatic hydrocarbon group or alkyl group.

Non-limiting examples of the alkyl group include methyl, ethyl, propyl, isopropyl, n-butyl, s-butyl, isobutyl, and tertiary butyl groups.

The inventors have conducted studies and found that a compound having a pyrene skeleton is less likely to degrade even if electrons and/or holes are injected thereinto. Meanwhile, the host contained in the light-emitting sublayer included in the organic light-emitting device according to aspects of the present invention plays a role in transporting electrons and holes to the dopants (first and second dopants). Thus, the compound having a pyrene skeleton may be used as the host. Furthermore, in particular, the compound having a pyrene skeleton has excellent electron transport properties. That is, the compound with a pyrene skeleton has a high electron mobility and has a low hole mobility compared with the electron mobility. Thus, the incorporation of the compound having a pyrene skeleton into the light-emitting sublayer enables us to drive the device at a low voltage and to enhance the power efficiency.

While specific examples of the host will be illustrated below, the present invention is not limited thereto.

[Chem. 1]

H-1

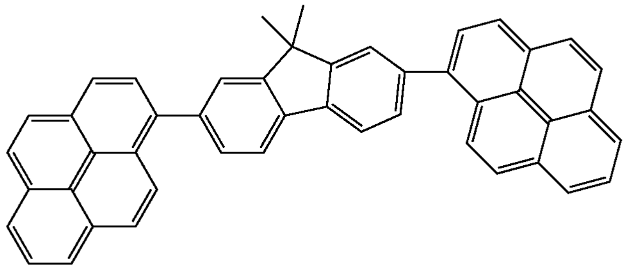

H-2

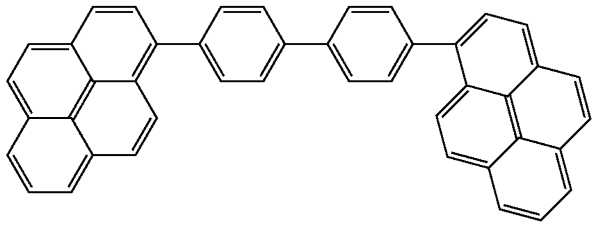

H-3

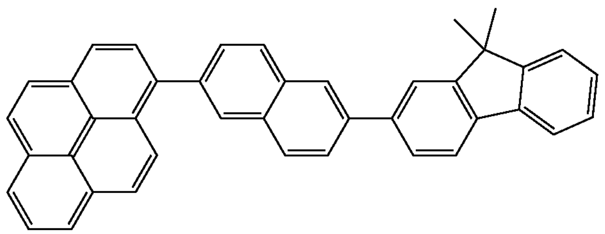

-continued
H-4
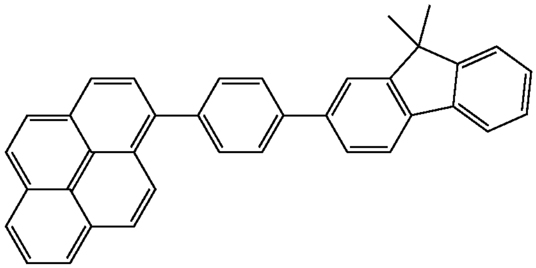
H-5
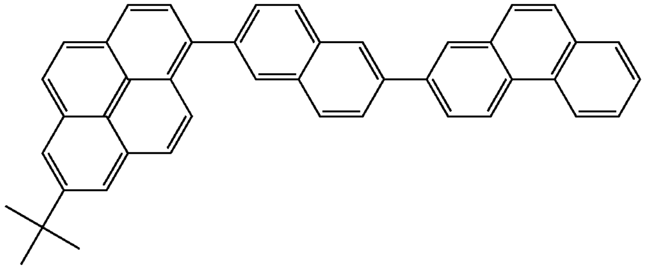
H-6
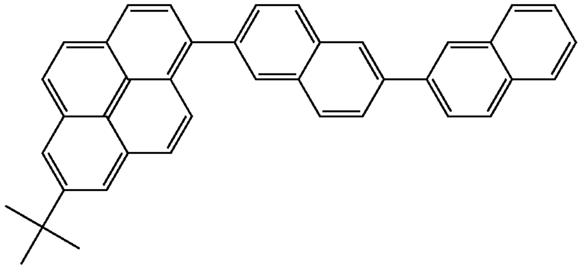
H-7
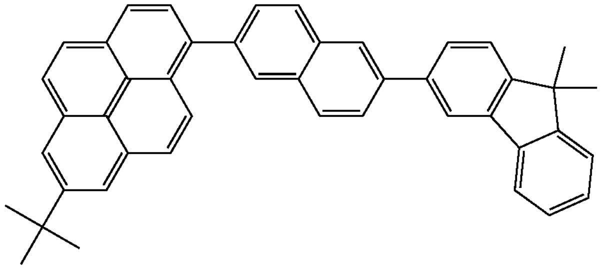
H-8
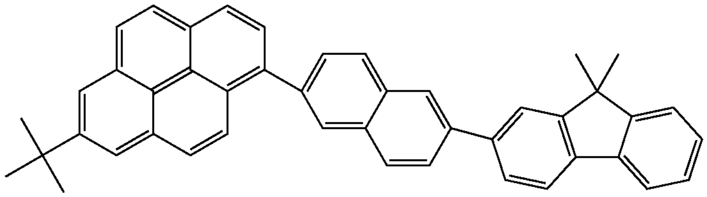

-continued
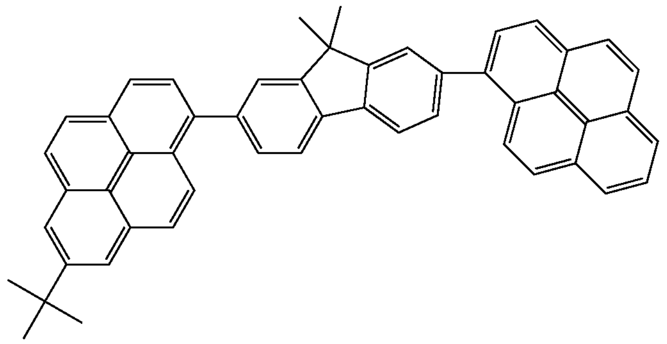
H-9
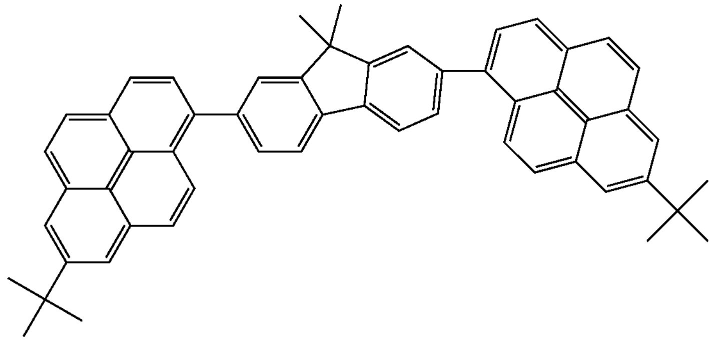
H-10
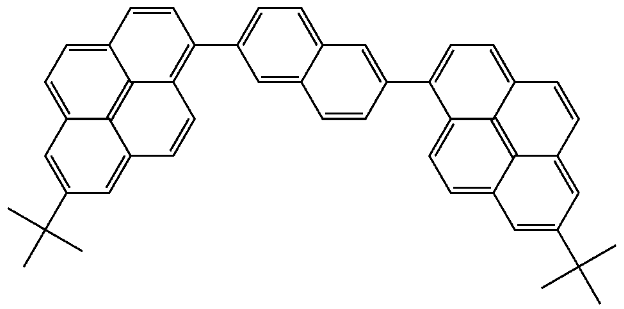
H-11
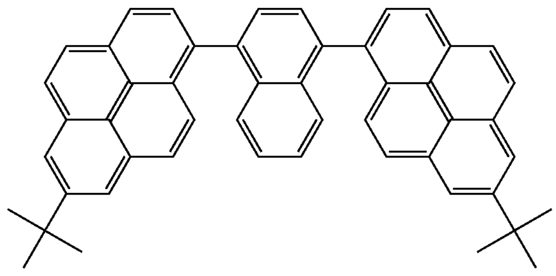
H-12

-continued
H-13
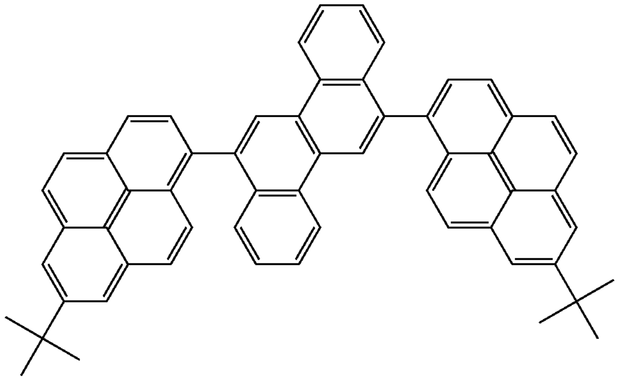
H-14
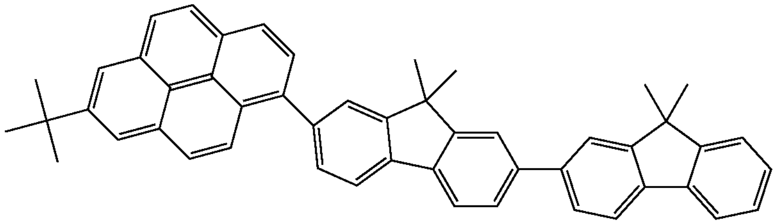
H-15
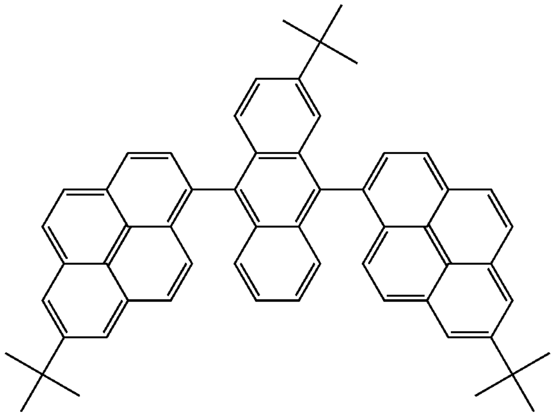
H-16
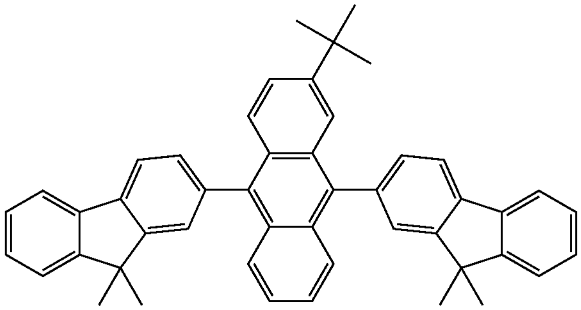

In aspects of the present invention, the first dopant may be a compound having satisfactory hole injection properties.

From the viewpoint that the second dopant may be a compound having a five-membered ring structure with an electron-trapping capability as described below and that the first dopant may be compatible with the second dopant, the first dopant may be a compound having a five-membered ring structure. In particular, the first dopant may be a compound having a basic skeleton with one of the following condensed rings D1-a and D1-b.

[Chem. 2]

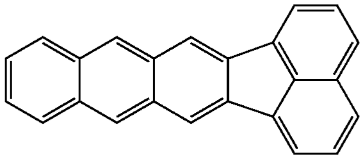

condensed ring D1-a

-continued

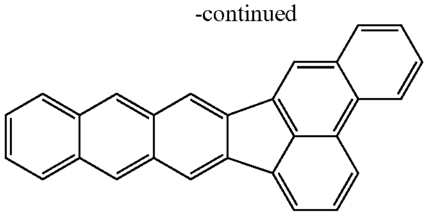

condensed ring D1-b

In the condensed rings D1-a and D1-b described above, in view of their molecular weights and the extent of the pi conjugation over the molecule, the first dopant may be a compound having a basic skeleton with the condensed ring D1-b.

To inhibit intermolecular interactions, a basic skeleton with D1-a or D1-b may have a substituent with a high degree of steric hindrance. Examples of the substituent include tert-butyl, phenyl, 2-methylphenyl, 3-methylphenyl, 4-methylphenyl, 4-ethylphenyl, 3,5-dimethylphenyl, 2,6-diethylphenyl, mesityl, 3-isopropylphenyl, 3-tert-butylphenyl, 4-isopropylphenyl, 4-tert-butylphenyl, biphenyl, and terphenyl groups.

While specific examples of the first dopant are illustrated below, the present invention is not limited thereto.

[Chem. 3]

D1-1

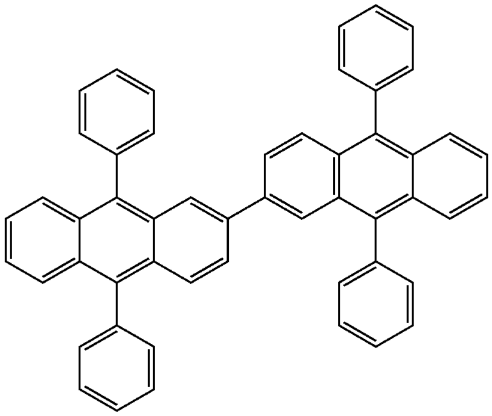

D1-2

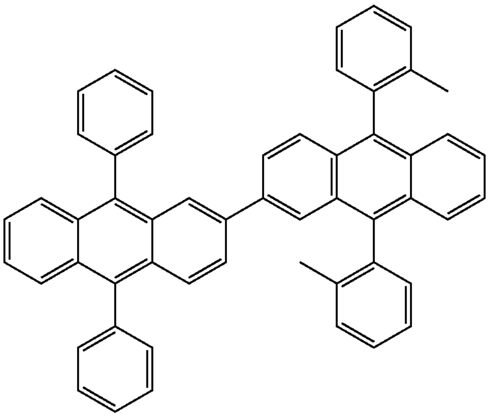

D1-3

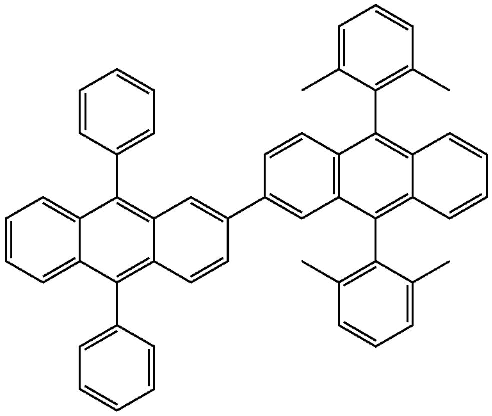

D1-4

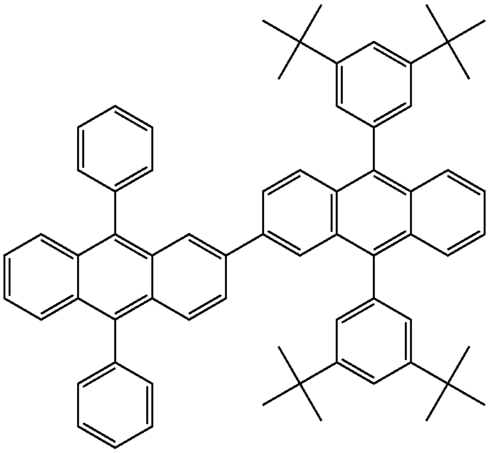

-continued
D1-5
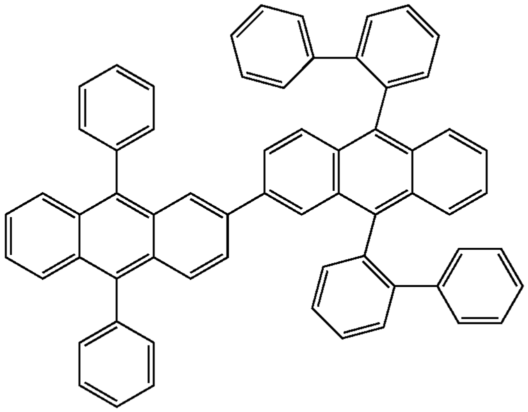
D1-6
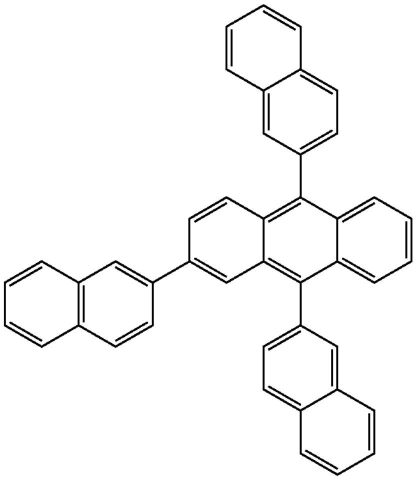
D1-7
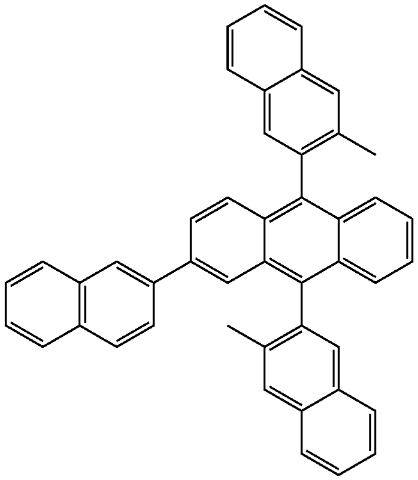
D1-8
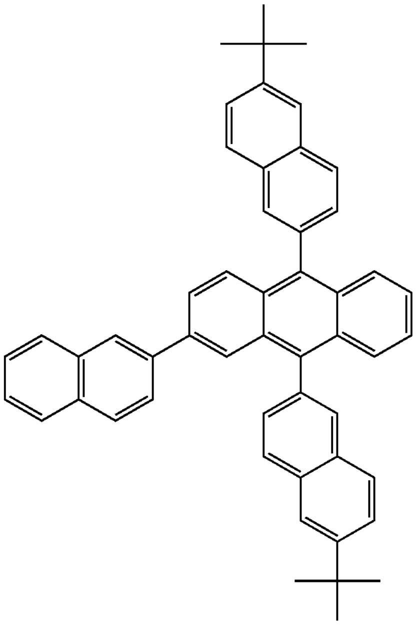
D1-9
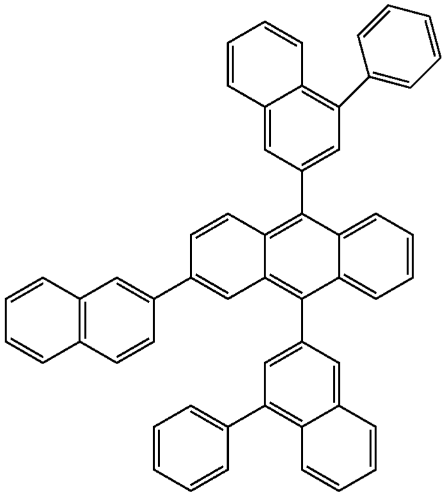
D1-10
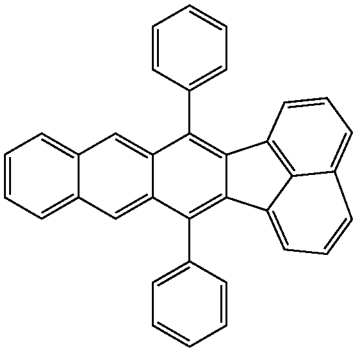

-continued
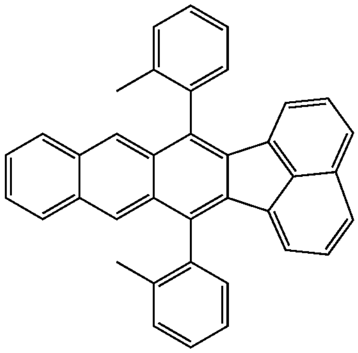
D1-11
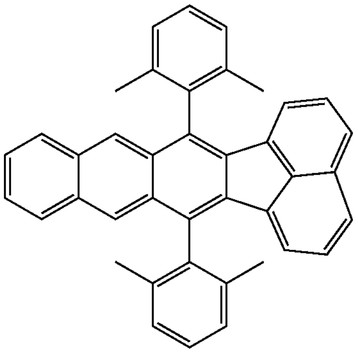
D1-12
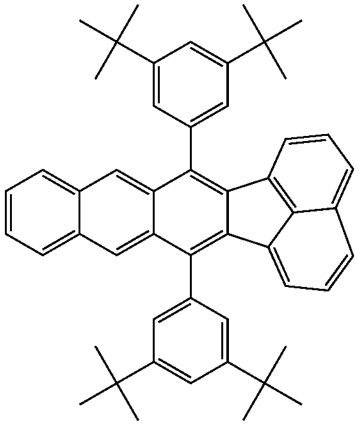
D1-13
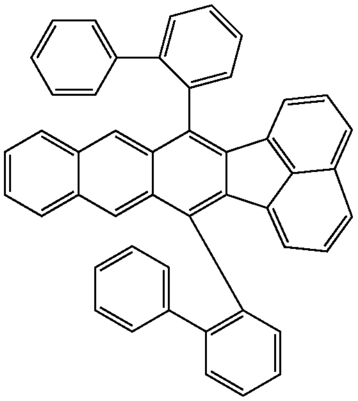
D1-14
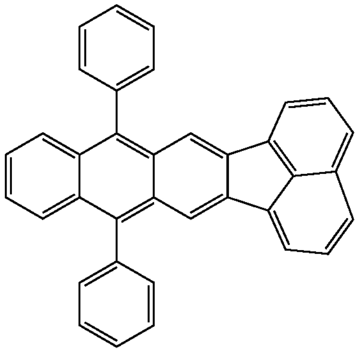
D1-15
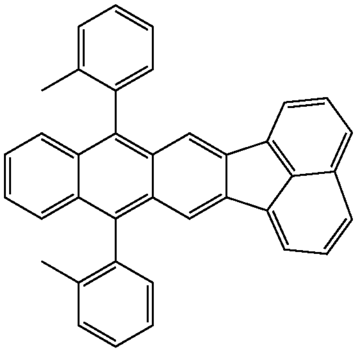
D1-16
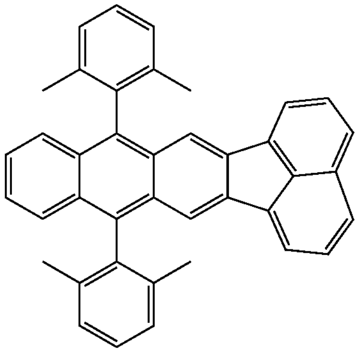
D1-17
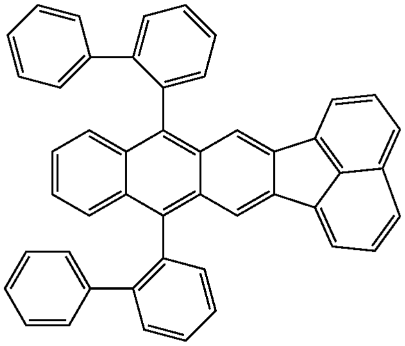
D1-18

-continued
D1-19
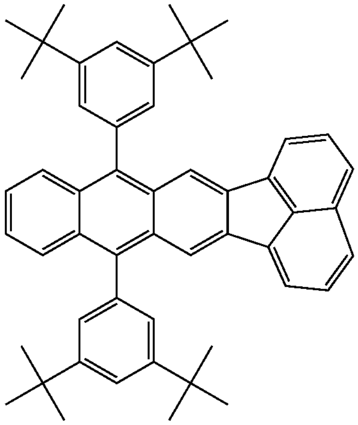
D1-20
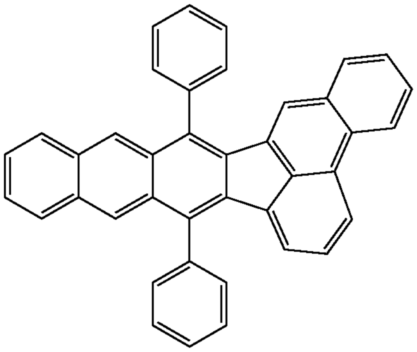
D1-21
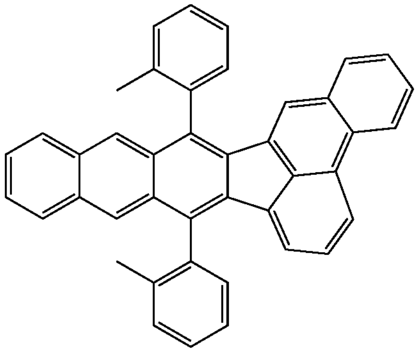
D1-22
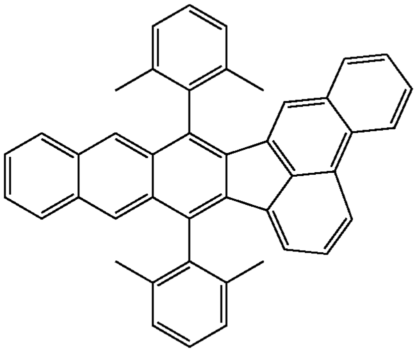
D1-23
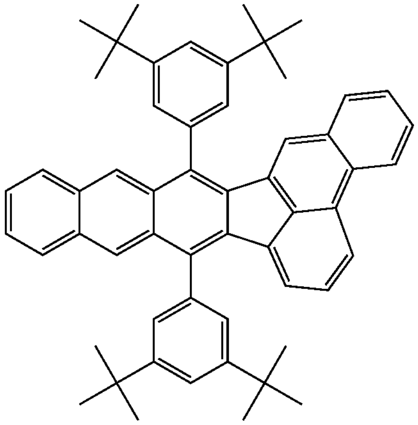
D1-24
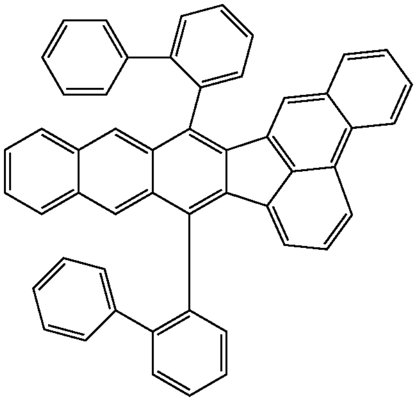
[Chem. 4]
D1-25
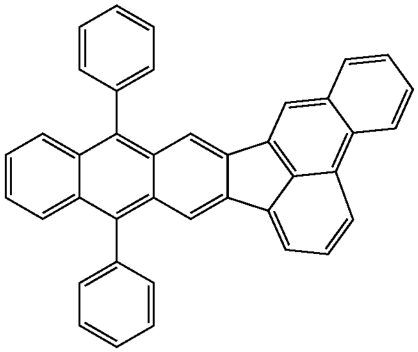
D1-26
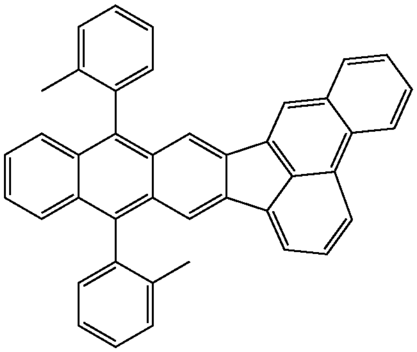

-continued
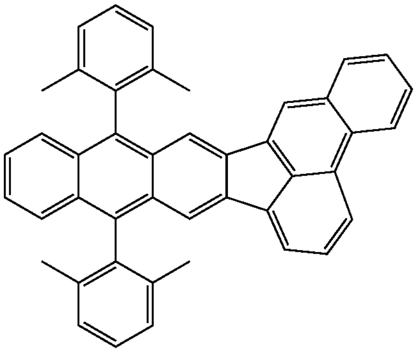
D1-27
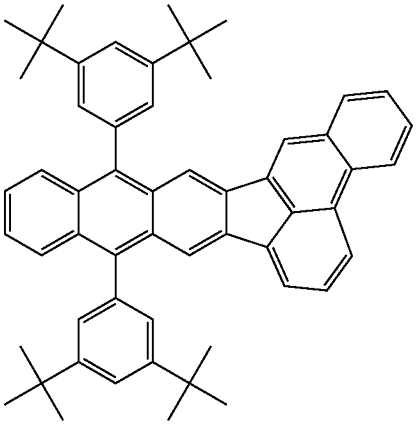
D1-28
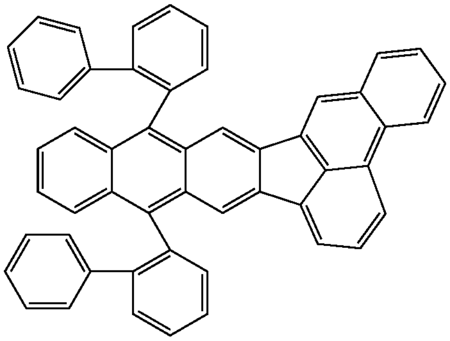
D1-29
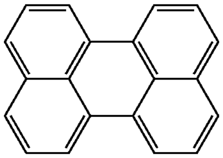
D1-30
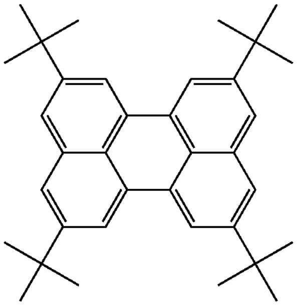
D1-31
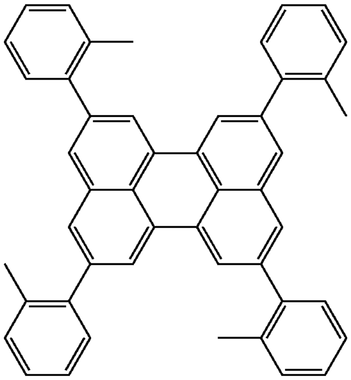
D1-32
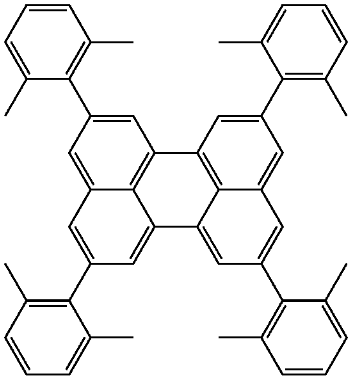
D1-33
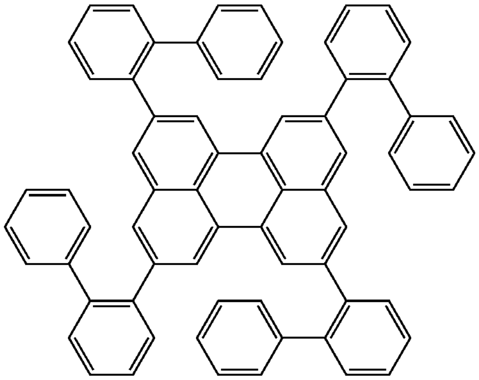
D1-34

-continued
D1-35
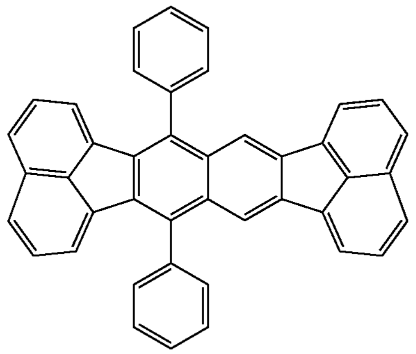
D1-36
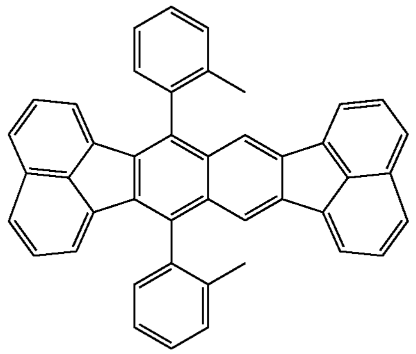
D1-37
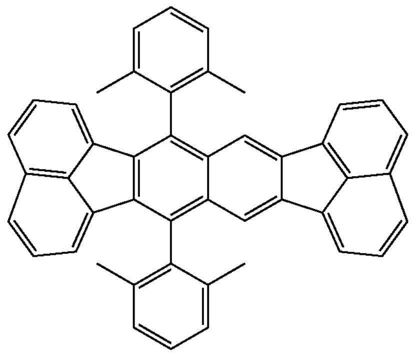
D1-38
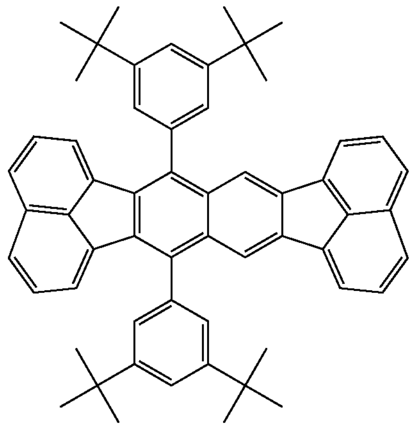
D1-39
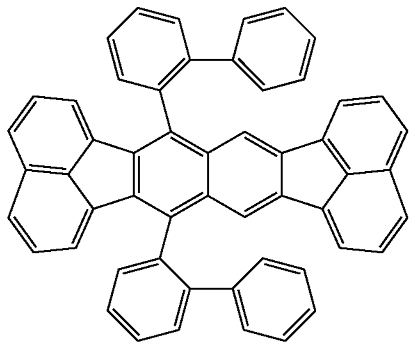
D1-40
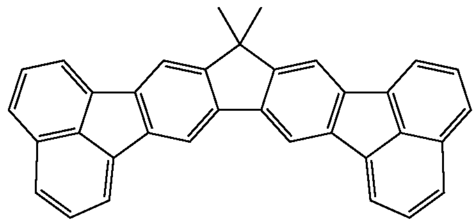
D1-41
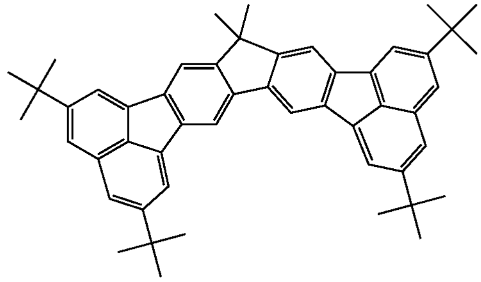
D1-42
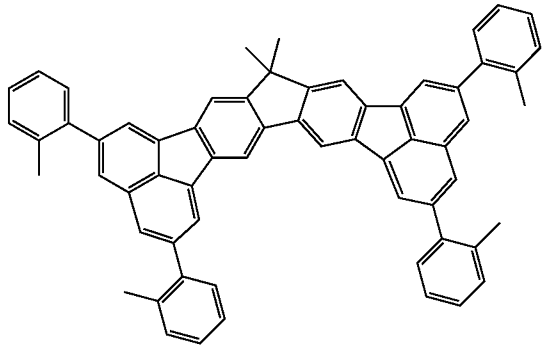

-continued

D1-43

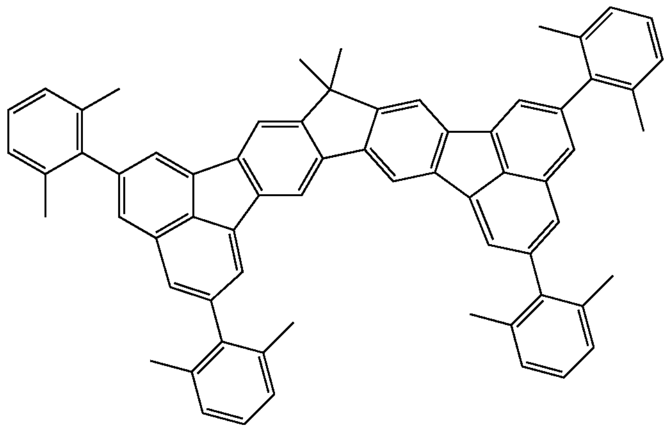

D1-44

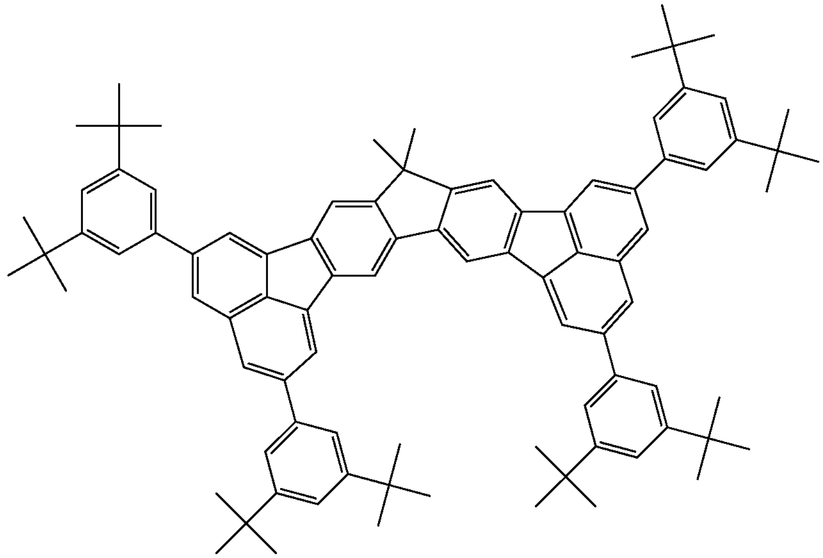

D1-45

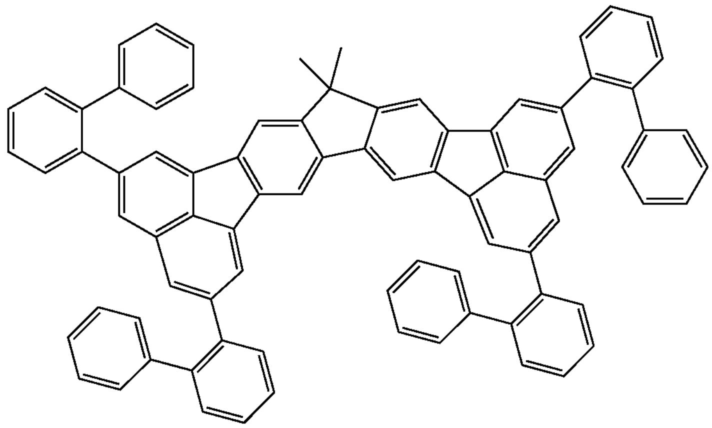

In aspects of the present invention, the second dopant is appropriately selected in view of the LUMO of the host, provided that the relationship (b) holds. Typically, the host has a LUMO energy level of about −2.7 eV. Thus, the energy level of LUMO (D2) may be −3.1 eV or less.

The second dopant may be a compound having a basic skeleton with a five-membered ring structure. The five-membered ring structure is electron attractive and has an electron-trapping capability. In aspects of the present invention, the value of |LUMO (D2)−LUMO (H)| may be large. The second dopant may be a compound having a basic skeleton with two or more five-membered ring structures. The presence of two or more five-membered ring structures in the basic skeleton is likely to reduce the LUMO energy level to more easily trap electrons in the light-emitting sublayer, thereby resulting in a reduction in electron mobility.

The inventors have conducted studies and have found that the light-emitting sublayer containing the second dopant preferably has an electron mobility of $10^{-6}$ $cm^2/Vs$ or less and more preferably $10^{-8}$ $cm^2/Vs$ or less. The incorporation of the second dopant that reduces the electron mobility into the light-emitting sublayer results in the localization of a luminous region to the interface between the light-emitting sublayer and the cathode, thus preventing the change of the state of a compound contained in the hole transport layer into an unstable anionic state due to the fact that electrons pass through the light-emitting sublayer and reach the hole transport layer.

The electron mobility in the light-emitting sublayer can be measured by transient current measurement using a time-of-flight method (TOF method). Specifically, the measurement is performed according to a process including the steps (i) to (iii):

(i) A thin film having a thickness of about 2 micrometers is formed on an ITO-coated glass substrate by vacuum evaporation;

(ii) an aluminum film serving as a counter electrode is deposited by evaporation; and (iii) the measurement of the resulting sample is performed with a TOF measurement system (TOF-301, manufactured by OPTEL Corp.) at an electric field intensity of $4\times10^5$ V/cm.

The second dopant may be a compound having a basic skeleton with a condensed ring described below.

[Chem. 5]

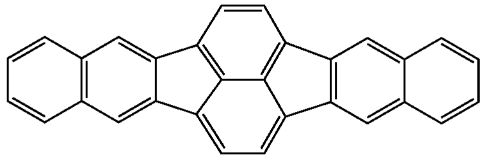

The LUMO of the condensed ring is highly delocalized over the molecule, thus resulting in only a small change of the structure of the compound when the state of the compound is changed from a neutral state to a state in which electrons are trapped. Furthermore, the compound has two five-membered ring structures in one skeleton and is thus likely to reduce the LUMO energy level. Moreove, the use of a light-emitting material having a basic skeleton with the condensed ring described above is likely to reduce the full width at half maximum, thereby resulting in the emission of green light with high color purity. To inhibit concentration quenching, the foregoing condensed ring serving as a basic skeleton may have a substituent with a high degree of steric hindrance.

While specific examples of the second dopant are described below, the present invention is not limited thereto.

[Chem. 6]

D2-1

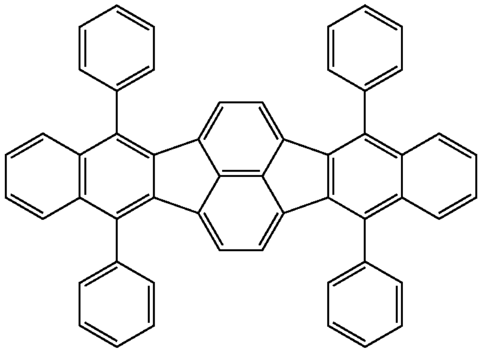

D2-2

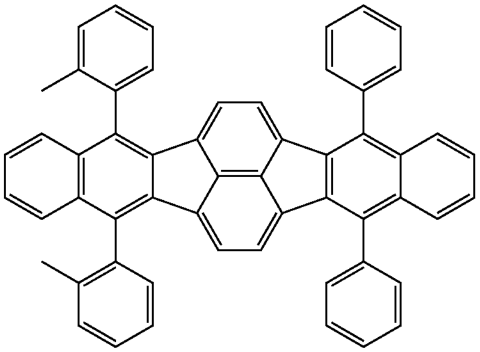

D2-3

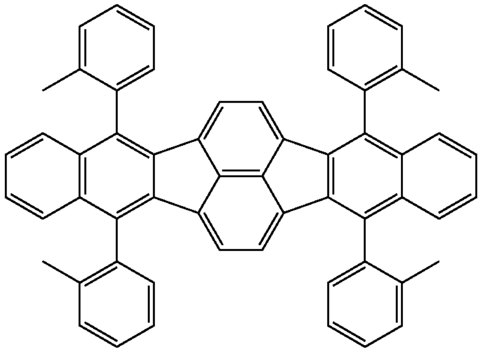

D2-4

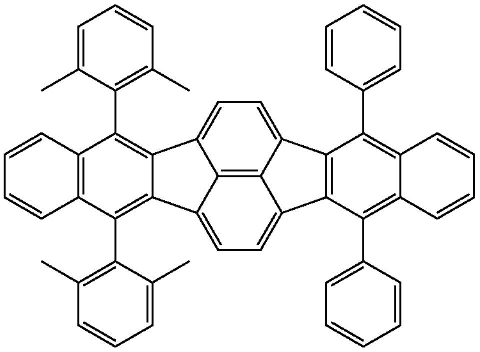

-continued
D2-5
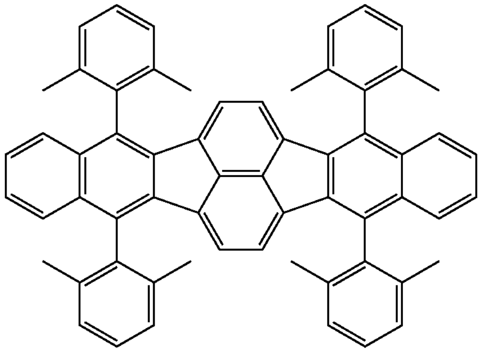
D2-6
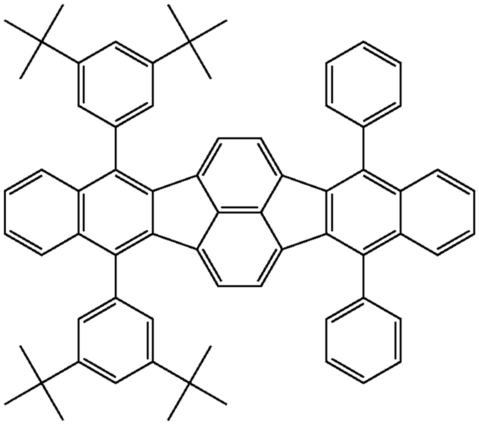
D2-7
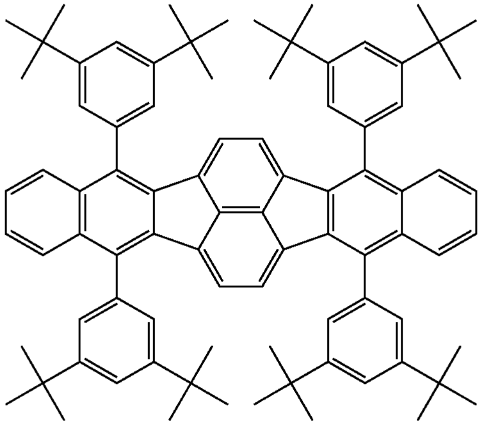
D2-8
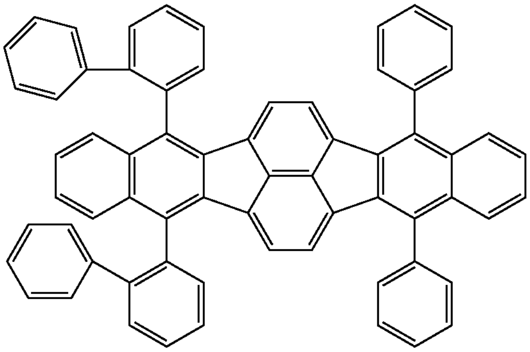
D2-9
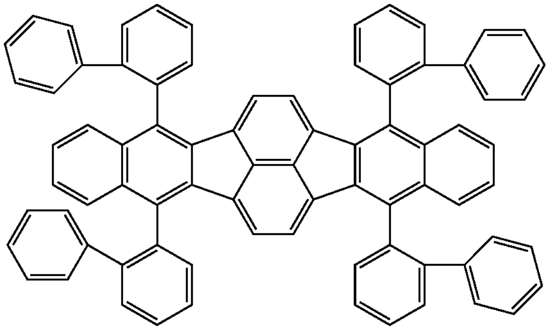
D2-10
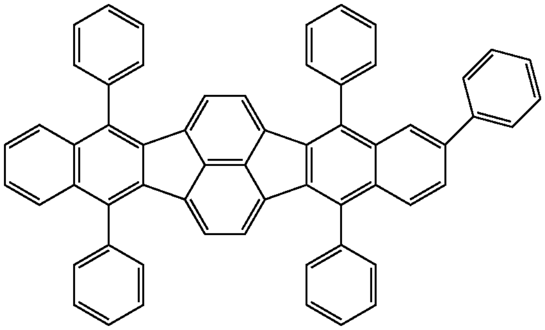
D2-11
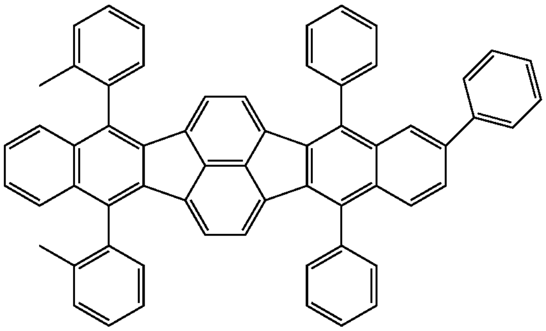
D2-12
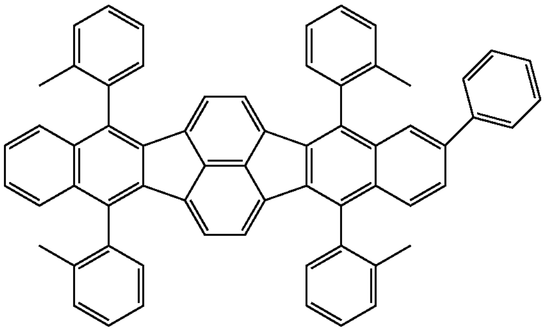

-continued
D2-13
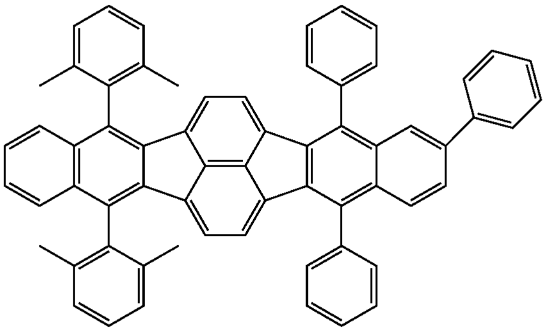
D2-14
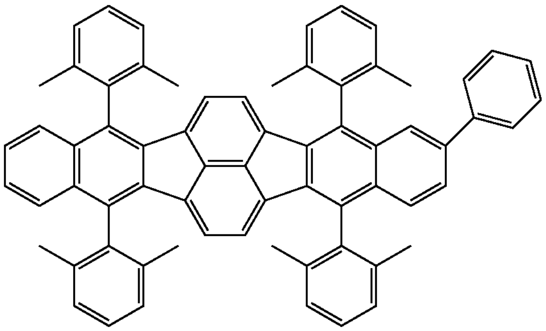
D2-15
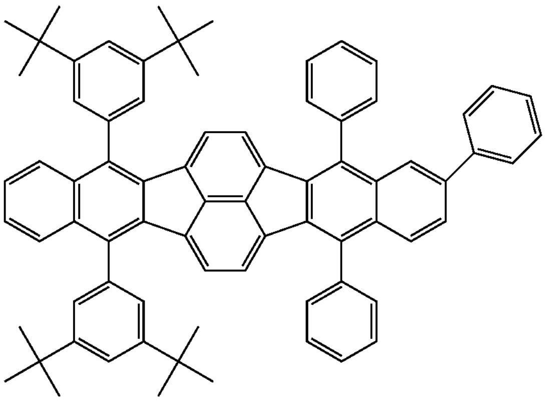
D2-16
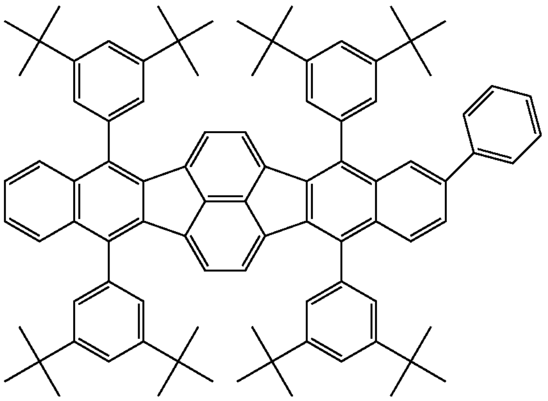
D2-17
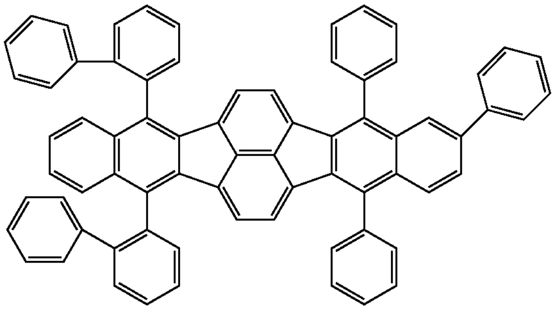
D2-18
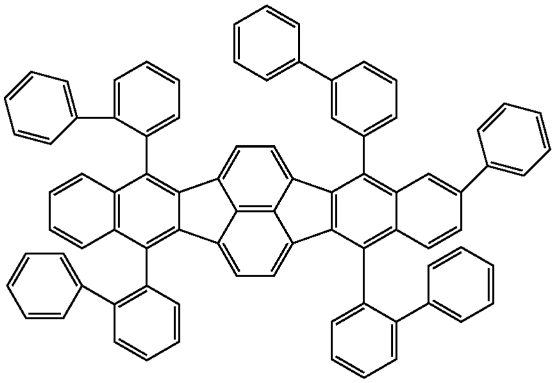
D2-19
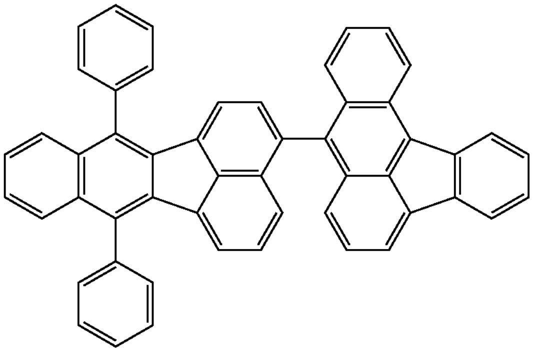
D2-20
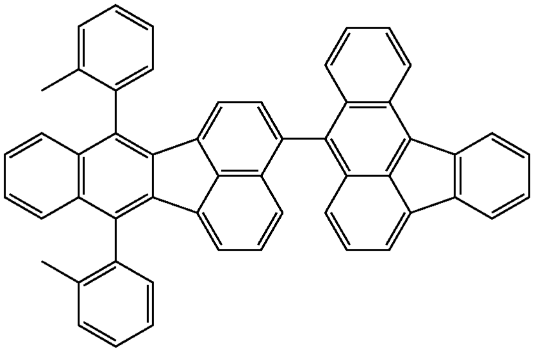

-continued
[Chem. 7]
D2-21
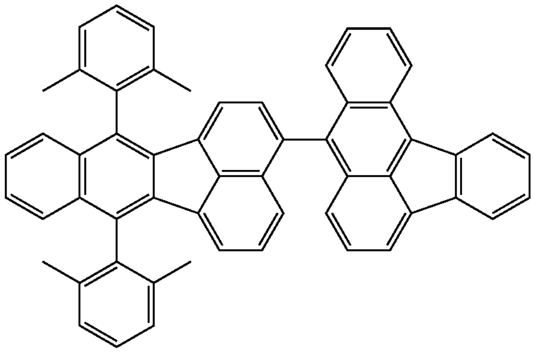
D2-22
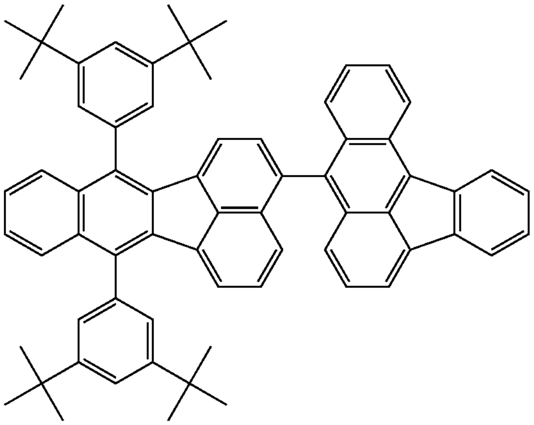
D2-23
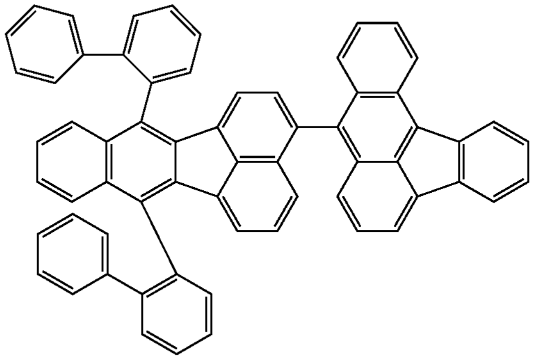
D2-24
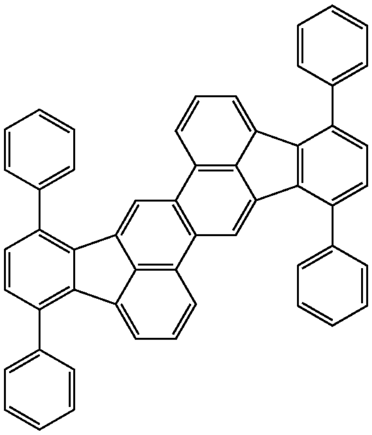
D2-25
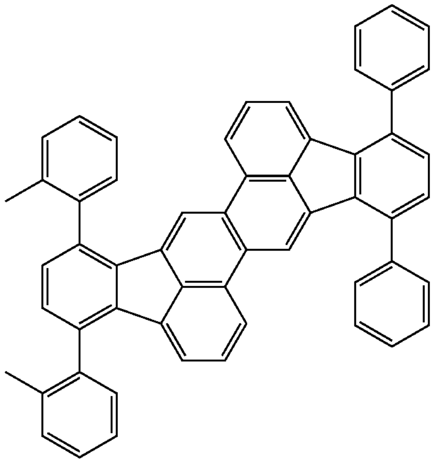
D2-26
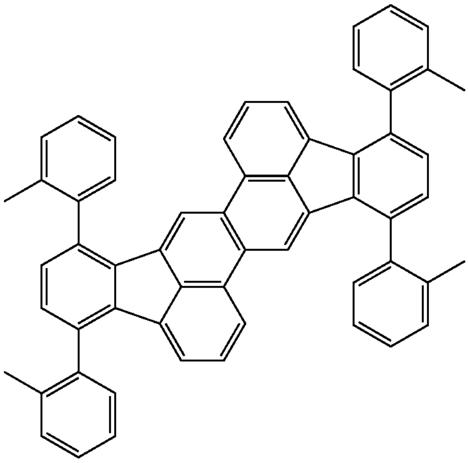

-continued
D2-27
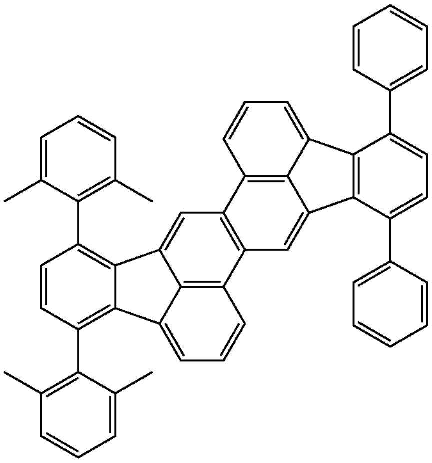
D2-28
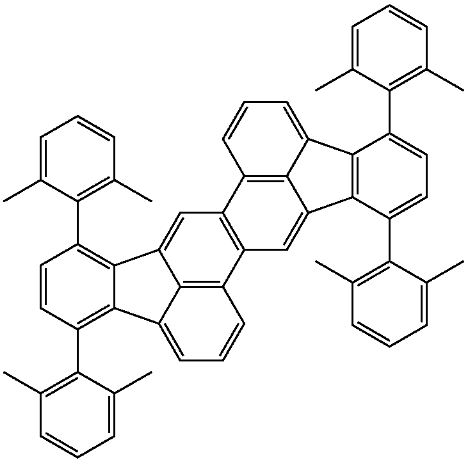
D2-29
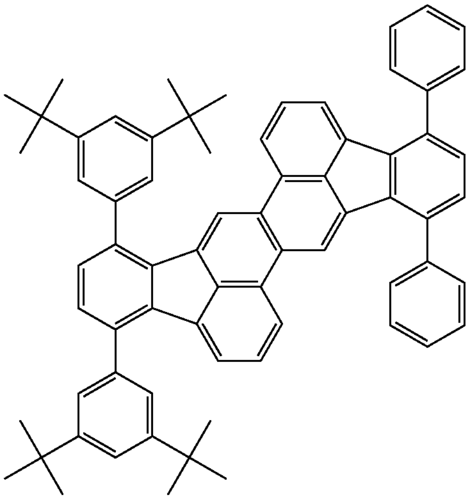
D2-30
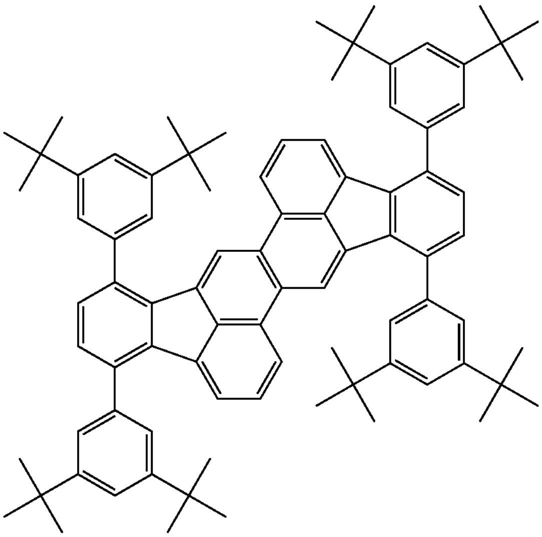
D2-31
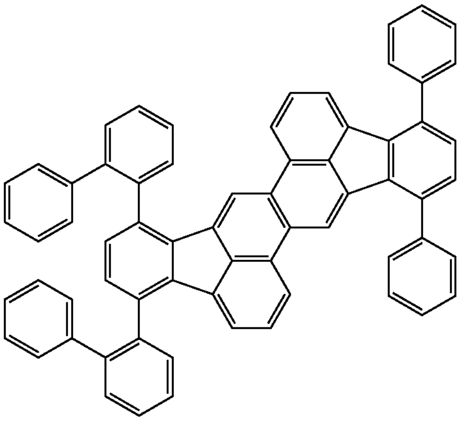
D2-32
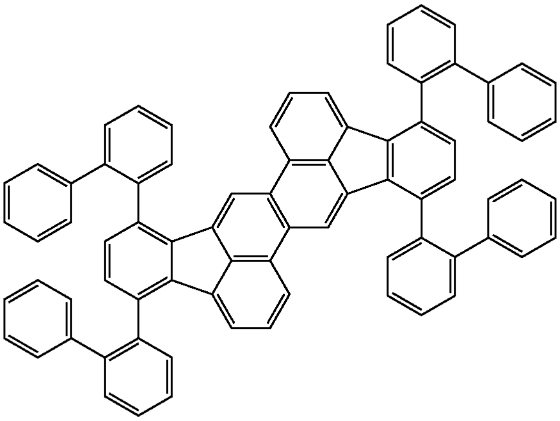

-continued
D2-33
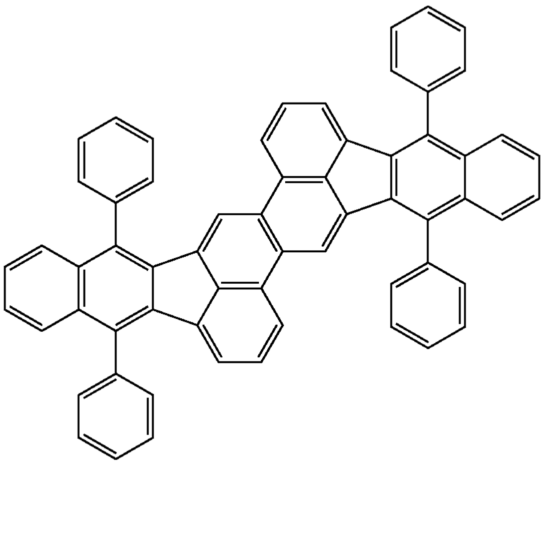
D2-34
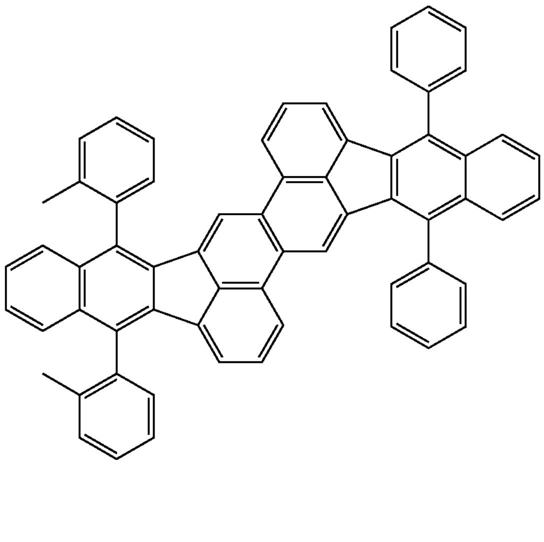
D2-35
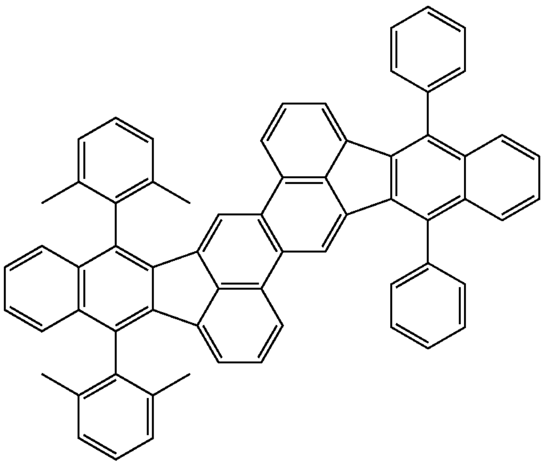
D2-36
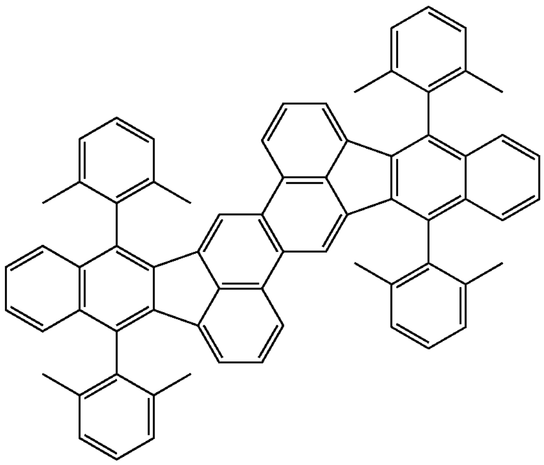
[Chem. 8]
D2-37
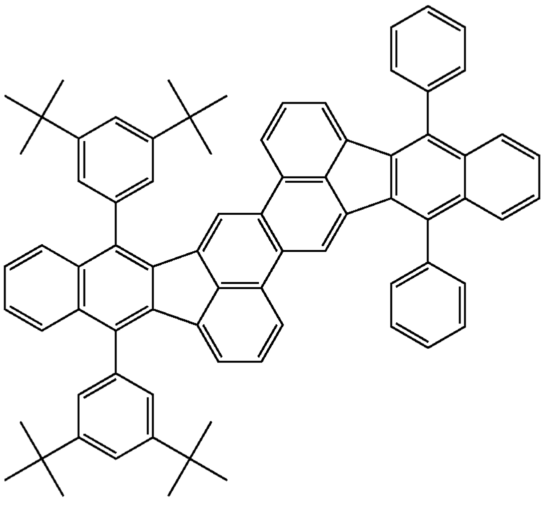
D2-38
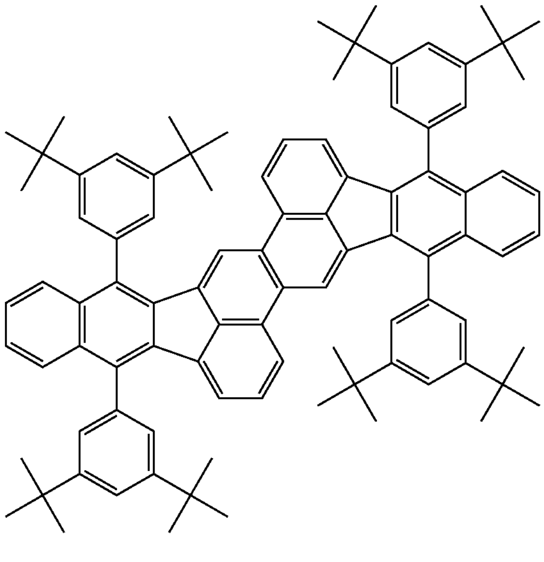

-continued

D2-39

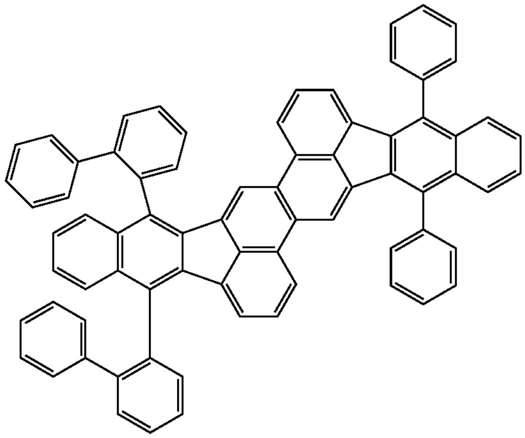

D2-40

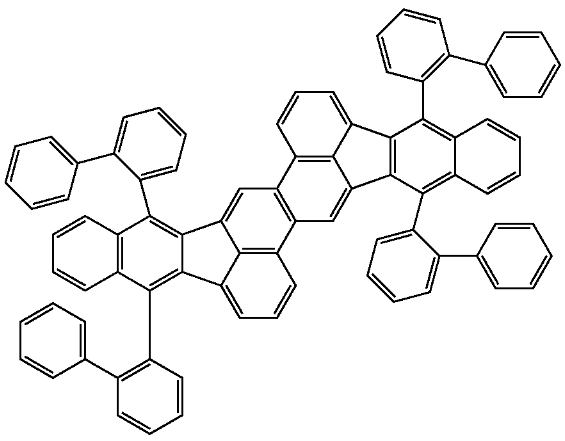

The host contained in the light-emitting sublayer has a role in transporting carriers. The host repeatedly undergoes oxidation and reduction by carriers supplied. Meanwhile, a compound consisting of a hydrocarbon is less likely to degrade even if the compound repeatedly undergoes oxidation and reduction. Thus, the host may be a compound consisting of a hydrocarbon, thereby improving the lifetime under continuous operation.

In addition, each of the first dopant and the second dopant may be a condensed aromatic compound consisting of a hydrocarbon from the viewpoint of achieving compatibility with the host. In aspects of the present invention, electrons are accumulated in the first dopant or the second dopant. Holes are accumulated in the first dopant. In the case where the first dopant in an anionic state is close to the second dopant in a cationic state, a charge-transfer complex is easily formed, thereby being liable to cause a reduction in luminous efficiency and a change in emission color. In particular, for a compound containing, for example, a nitrogen atom or an oxygen atom with lone-pair electrons, a charge-transfer complex is more easily formed because of a high charge density of an atom with lone-pair electrons. So, each of the first dopant and the second dopant composed of a compound consisting of a hydrocarbon inhibits the formation of the charge-transfer complex, thereby suppressing a reduction in luminous efficiency and a change in emission color.

Furthermore, when the first dopant is a compound consisting of a hydrocarbon, the compound has a high bipolarity compared with hetero compounds. In aspects of the present invention, the first dopant can accumulate holes and electrons in the light-emitting sublayer. Thus, the first dopant may have bipolarity. Moreover, the first dopant accumulates holes and thus may be a compound having excellent oxidation resistance. In addition, only a small change of the structure may be obtained when the state of the first dopant is changed from the ground state to a state in which holes are accumulated (singly occupied molecular orbital (SOMO)). To accomplish this, the LUMO may be delocalized over a relatively wide region of the molecule.

In aspects of the present invention, the light-emitting sublayer may have a first dopant content of 10% to 35% by weight. A first dopant content of less than 10% by weight does not result in the first dopant having excellent hole injection properties, thereby causing an increase in driving voltage and a reduction in luminous efficiency. A first dopant content exceeding 35% by weight causes a reduction in the electron-trapping capability of the light-emitting sublayer because electrons pass through the light-emitting sublayer with the first dopant, thereby reducing the lifetime.

In aspects of the present invention, the following relationships (d) and (e) may hold in addition to the relationships (a) to (c) described above:

(d) |second maximum emission wavelength (H)−first maximum emission wavelength (D1)| is equal to or less than 7 nm, and (e) |second maximum emission wavelength (D1)−first maximum emission wavelength (D2)| is equal to or less than 7 nm.

In the relationship (d), the second maximum emission wavelength (H) indicates the second maximum emission wavelength of the host. The term "first maximum emission wavelength" used here indicates the wavelength of the shortest wavelength peak among peaks in an emission spectrum. The term "second maximum emission wavelength" indicates the wavelength of the second longest wavelength peak among peaks in an emission spectrum. If the peak wavelength is unclear in determining the second maximum emission wavelength, after peak separation is performed, the second maximum emission wavelength is determined. In the relationship (e), the second maximum emission wavelength (D1) indicates the second maximum emission wavelength of the first dopant.

Energy transfer occurs between the same energy levels in a region in which the emission spectrum of donor molecules and the absorption spectrum of acceptor molecules overlap each other. One of the first dopant and the second dopant contained in the light-emitting sublayer included in the organic light-emitting device according to aspects of the present invention has bipolarity and is a compound with a structure that is only slightly changed when the state of the compound is changed from the ground state to an excited state. Thus, the first maximum emission wavelengths of the first dopant and the second dopant correspond to the first maximum absorption wavelength of the absorption spectrum and are substantially equal to each other. Thus, the emission peak of the first dopant may be located near the first maximum emission wavelength of the second dopant to which energy is transferred from the first dopant. Furthermore, the relationship (e) may hold. This facilitates the energy transfer from the first dopant to the second dopant. Furthermore, the effect of the present invention is easily provided. Moreover, in the case where the relationship (d) holds, the effect of the present invention is easily provided as in the case where the relationship (e) holds.

The second dopant may be fluorescent (emission from a singlet excited state) or phosphorescent (emission from a triplet excited state). In the case where a phosphorescent light-emitting material is used as the second dopant, other materials contained in the light-emitting sublayer are required to have higher triplet energy levels than the phosphorescent light-emitting material in order to efficiently emit light from the light-emitting material.

Other members included in the organic light-emitting device according to aspects of the present invention will be described below.

A hole injection and transport material for the hole injection layer and the hole transport layer may have excellent hole mobility to facilitate the injection of holes from the anode and transport the injected holes to the light-emitting sublayer. Non-limiting examples of low- and high-molecular-weight materials that have capabilities of injecting and transporting holes include triarylamine derivatives, phenyl diamine derivatives, triazole derivatives, carbazole derivatives, oxadiazole derivatives, imidazole derivatives, pyrazoline derivatives, pyrazolone derivatives, oxazole derivatives, fluorenone derivatives, hydrazone derivatives, stilbene derivatives, phthalocyanine derivatives, porphyrin derivatives, polyvinyl carbazole, polysilylene, polythiophene, and other conductive polymers.

An electron injection and transport material for the electron injection layer and the electron transport layer can be selected from materials having functions of facilitating the injection of electrons from the cathode and transporting injected electrons to the light-emitting sublayer and is selected in view of, for example, the balance between the hole mobility of the hole transport material and electron mobility. Non-limiting examples of a material having capabilities of injecting and transporting electrons include oxadiazole derivatives, pyrazine derivatives, triazole derivatives, triazine derivatives, perylene derivatives, quinoline derivatives, quinoxaline derivatives, anthracene derivatives, chrysene derivatives, fluorene derivatives, fluorenone derivatives, anthrone derivatives, phenanthroline derivatives, fluoranthene derivatives, and organometallic complexes. Furthermore, a material having a high ionization potential may be used for a hole blocking layer.

The anode may be composed of a material having a higher work function. Examples of the material that can be used include elemental metals, such as gold, platinum, silver, copper, nickel, palladium, cobalt, selenium, vanadium, and tungsten; alloys of two or more of these metals; and metal oxides, such as tin oxide, zinc oxide, indium oxide, indium tin oxide (ITO), and indium zinc oxide. Furthermore, conductive polymers, such as polyaniline, polypyrrole, polythiophene, and poly(phenylene sulfide), may be used. These substances for the electrode may be used alone or in combination. The anode may be formed of a single layer or multiple layers.

The cathode may be composed of a material having a lower work function. Examples of the material that can be used include elemental metals, such as lithium, sodium, potassium, calcium, magnesium, aluminum, indium, ruthenium, titanium, manganese, yttrium, silver, lead, tin, and chromium; and alloys of two or more of these metals, e.g., lithium-indium, sodium-potassium, magnesium-silver, aluminum-lithium, aluminum-magnesium, and magnesium-indium). Metal oxides such as indium tin oxide (ITO) may be used. These substances for the electrode may be used alone or in combination. The cathode may be formed of a single layer or multiple layers. Furthermore, a layer composed of an electron transport material and one selected from an alkali metal, an alkaline-earth metal, and an oxide thereof may be formed as the electron injection layer by coevaporation between the cathode and the electron transport layer. The electron injection layer is effective in reducing the driving voltage.

Examples of the substrate used in aspects of the present invention include, but are not limited to, opaque substrates, such as metallic substrates and ceramic substrates; and transparent substrates, such as glass substrates, quartz substrates, and plastic sheets. Furthermore, it is also possible to control the emission color using a color filter film, a fluorescent color conversion filter film, a dielectric reflection film, or the like on the substrate. Moreover, a thin-film transistor (TFT) may be formed on the substrate and connected to the organic light-emitting device.

In order to prevent contact with oxygen, water, and so forth, a protective layer or a sealing layer may be arranged on the resulting device. Examples of the protective layer include diamond thin films, films composed of inorganic substances, such as metal oxides and metal nitride, polymeric films composed of fluorinated resins, poly-p-xylene, polyethylene, silicone resins, polystyrene resins, and so forth, and photocurable resins. Furthermore, the device may be covered with, for example, glass, a gas-impermeable film, a metal and packaged in an appropriate sealing resin.

The organic compound layer included in the organic light-emitting device according to aspects of the present invention may be formed by various methods. Typically, a thin film may be formed by vacuum evaporation, ionized evaporation, sputtering, or plasma-enhanced chemical vapor deposition (CVD). Alternatively, a thin film may be formed by a known coating method, e.g., spin coating, dipping, casting, the Langmuir-Blodgett (LB) technique, or an ink-jet method, using a solution of a material dissolved in an appropriate solvent. In particular, in the case of forming a film by a coating method, the film may be formed in combination with an appropriate binder resin.

The binder resin may be selected from a wide variety of resins having binding properties. Non-limiting examples of the binder resin include polyvinyl carbazole resins, polycarbonate resins, polyester resins, polyarylate resins, polystyrene resins, ABS resins, polybutadiene resins, polyurethane resins, acrylic resins, methacrylic resins, butyral resins, polyvinyl acetal resins, polyamide resins, polyimide resins, polyethylene resins, polyethersulfone resins, diallyl phthalate resins, phenol resins, epoxy resins, silicone resins, polysulfone resins, and urea resins. These resins may be homopolymers or copolymers. Furthermore, these resins may be used alone or in combination. Moreover, additives, such as a known plasticizer, an antioxidant, and an ultraviolet absorber, may be combined, as needed.

The organic light-emitting device according to aspects of the present invention may be used as a single device. Alternatively, a plurality of the organic light-emitting devices may be combined to form an apparatus or an array. For an organic light-emitting apparatus including the plural organic light-emitting devices, the organic light-emitting devices, which are component members, are made to emit light by, for example, passive-matrix driving or active-matrix driving. Furthermore, for the organic light-emitting apparatus including the plural organic light-emitting devices, light beams emitted from the devices may have a single color or two or more colors. In the case where the light beams emitted from the devices have two or more colors, full-color emission can be realized. Furthermore, the organic light-emitting device according to aspects of the present invention may have a bottom-emission structure, in which light emerges from the substrate, or a top-emission structure, in which light emerges from a surface opposite the substrate. Moreover, a tandem structure, in which at least one structure corresponding to the device is stacked, may be formed.

The organic light-emitting device according to aspects of the present invention may be used as a lighting device, a display, or an exposing light source of an image forming apparatus using an electrographic method. For the lighting device, one organic light-emitting device may be used. For the display or the exposing light source of an image forming apparatus using an electrographic method, the plural organic light-emitting devices may be used. The term "display" indicates an image display unit used as a display portion of a television set, a personal computer, or an electronic apparatus. Examples of the display portion of an electronic apparatus include display portions used in vehicles, image display portions of digital cameras, and operation panels of office machines such as copiers and laser printers.

Figure 3:
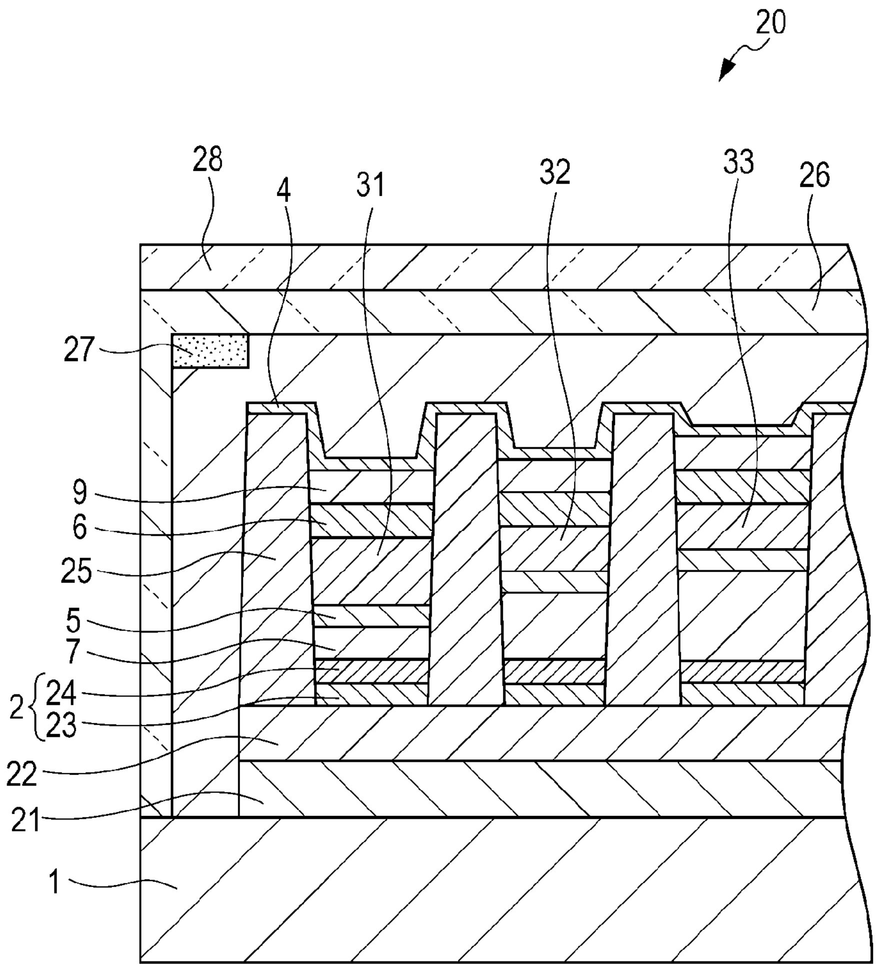
FIG. 3 is a cross-sectional view of a display including an organic light-emitting device according to aspects of the present invention.

Mobile equipment is required to have a low-power display because of power supply limitation. Here, a full-color RGB display including the organic light-emitting device according to aspects of the present invention mounted on mobile equipment, e.g., a digital still camera or digital video camera, will be described below with reference to the attached drawing. FIG. 3 is a schematic cross-sectional view of a display including the organic light-emitting device according to aspects of the present invention. In a display 20 illustrated in FIG. 3, the organic light-emitting device according to aspects of the present invention may be arranged at a pixel, in particular, a green (G) pixel, in a display portion. A method for producing the display illustrated in FIG. 3 will be described in detail in examples below.

EXAMPLES

While the present invention will be specifically described by examples, the present invention is not limited to these examples.

Synthetic Example 1

Synthesis of Exemplary Compound D1-20

Exemplary compound D1-20 was synthesized as a first dopant according to a synthetic scheme described below.

[Chem. 9]

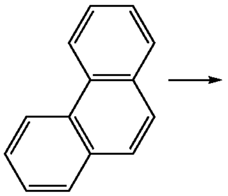

XX-1

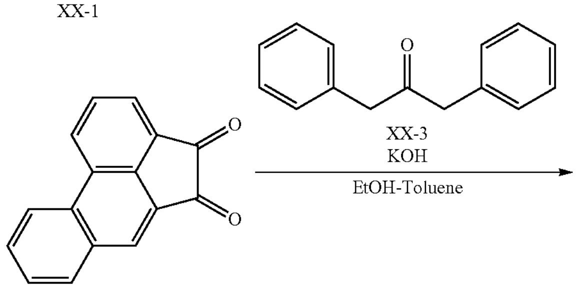

XX-2

-continued

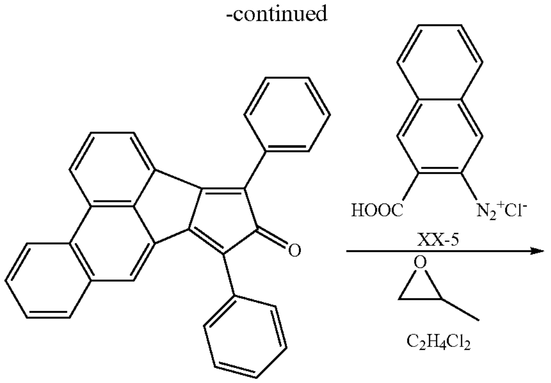

XX-4

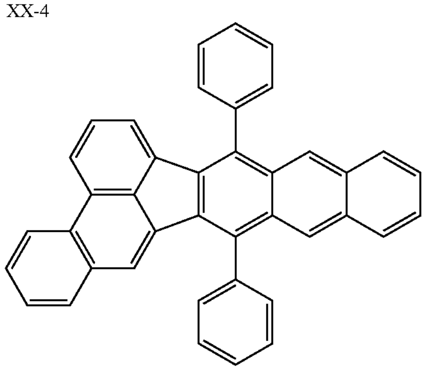

exemplary compound D1-20

(1) Synthesis of XX-2

XX-2 was synthesized from XX-1 according to a method described in Journal of American Chemical Society, 91, 918 (1969).

(2) Synthesis of XX-4

Reagents and a solvent described below were charged into a 20-mL reaction vessel.

XX-2: 1.8 g (7.7 mmol)

XX-3: 1.6 g (7.7 mmol)

Toluene: 10 mL

Ethanol: 100 mL

Next, a 0.5 N potassium hydroxide ethanol solution (20 mL) was slowly added dropwise to the resulting reaction solution under stirring. The reaction solution was heated to 75 degrees (Celsius) and stirred at this temperature (75 degrees (Celsius)) for 3 hours. The reaction solution was cooled to room temperature to precipitate crystals. The crystals were recovered by filtration and washed with water and then methanol to give 1.8 g (yield: 58%) of XX-4.

(3) Synthesis of Exemplary Compound D1-20

Reagents and a solvent described below were charged into a 50-mL reaction vessel.

XX-4: 0.9 g (2.2 mmol)

XX-5: 0.8 g (4.4 mmol)

Xylene: 60 mL

The resulting reaction solution was refluxed with stirring for 1 hour. After the completion of the reaction, the reaction solution was condensed under reduced pressure and subjected to separation and purification by silica-gel chromatography (developing solvent: chloroform/hexane=1/5). ecrystallization from toluene-ethanol gave 0.2 g (0.38 mmol, yield: 18%) of exemplary compound D1-20 as a yellow powder.

The structure of the compound was determined by mass spectrometry (MS) and nuclear magnetic resonance (NMR) spectroscopy. That is, a mass of 504, which is $M^+$ of the compound, was observed by matrix-assisted laser desorption-ionization mass spectrometry (MALDI-MS). Furthermore, NMR results were described below.

$^1$H-NMR ($CDCl_3$, 500 MHz) delta (ppm): 8.57 (d, 1H), 8.37 (d, 1H), 8.19 (s, 1H), 8.16 (s, 1H), 7.85 (m, 2H), 7.81-7.64 (m, 10H), 7.60 (m, 2H), 7.51-7.45 (m, 2H), 7.40 (m, 2H), 6.82 (s, 1H), and 6.69 (s, 1H).

Synthesis Example 2

Synthesis of Exemplary Compound D1-25

(1) Synthesis of xx-8

[Chem. 10]

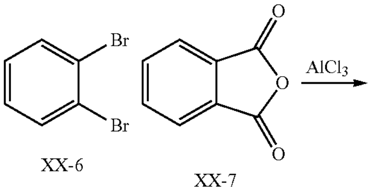

XX-6 XX-7

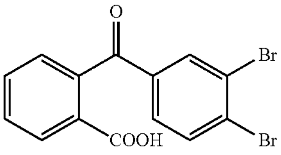

XX-8

Reagents and a solvent described below were charged into a reaction vessel.

XX-6: 40 g (170 mmol)

XX-7: 6.2 g (42 mmol)

$AlCl_3$: 10 g

Argon was introduced into the reaction vessel, so that the reaction vessel containing the reaction system was filled with an argon atmosphere. The reaction solution was heated to 80 degrees (Celsius) and stirred at this temperature (80 degrees (Celsius)) for 2 hours. After cooling the reaction solution, an aqueous solution of HCl (1.0 M) was added thereto. Chloroform was then added thereto. The separation of two layers was performed to recover the organic layer. The organic layer was dried over sodium sulfate. Removal of the solvent under reduced pressure gave a crude product. Recrystallization of the crude product from toluene gave 9.2 g (yield: 56%) of xx-8.

(2) Synthesis of xx-9

[Chem. 11]

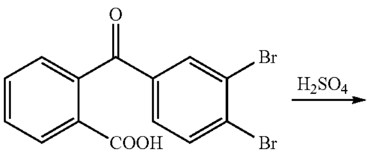

XX-8

-continued

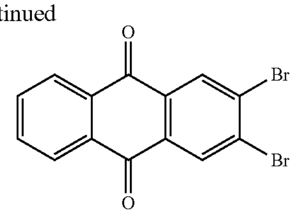

XX-9

Reagents described below were charged into a reaction vessel.

XX-8: 6 g (15.6 mmol)

concentrated sulfuric acid: 30 mL

Argon was introduced into the reaction vessel, so that the reaction vessel containing the reaction system was filled with an argon atmosphere. The reaction solution was heated to 130 degrees (Celsius) and stirred at this temperature (130 degrees (Celsius)) for 2 hours. The reaction solution was cooled to room temperature to precipitate crystals. The crystals were recovered by filtration and washed with water and then methanol to give 3.6 g (yield: 63%) of xx-9.

(3) Synthesis of xx-11

[Chem. 12]

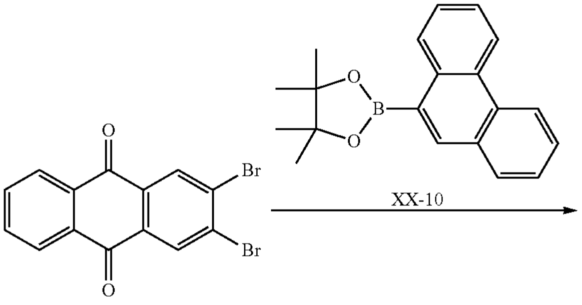

XX-9

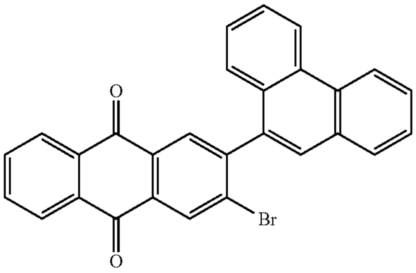

XX-11

Reagents and a solvent described below were charged into a reaction vessel.

XX-9: 3 g (8.2 mmol)

XX-10: 2.5 g (8.2 mmol)

Toluene: 40 mL

Ethanol: 10 mL

2 M sodium carbonate aqueous solution: 10 mL

Argon was introduced into the reaction vessel, so that the reaction vessel containing the reaction system was filled with an argon atmosphere. Then 150 mg of tetrakis(triphenylphosphine)palladium was added thereto. The reaction solution was heated to 75 degrees (Celsius) and stirred at this temperature (75 degrees (Celsius)) for 12 hours. The reaction solution was cooled to precipitate crystals. The crystals were recovered by filtration and washed with water and then methanol to give 2.4 g (yield: 64%) of xx-11.

(4) Synthesis of xx-12

[Chem. 13]

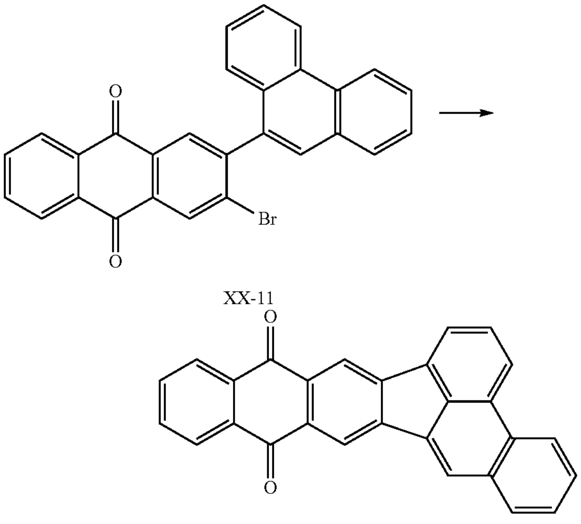

XX-11

XX-12

Reagents and a solvent described below were charged into a reaction vessel.

XX-11: 2 g (4.4 mmol)

Diazabicycloundecene: 2 g

Dimethylformamide: 100 mL

Argon was introduced into the reaction vessel, so that the reaction vessel containing the reaction system was filled with an argon atmosphere. Then 150 mg of bis(triphenylphosphine)palladium dichloride was added thereto. The reaction solution was heated to 120 degrees (Celsius) and stirred at this temperature (120 degrees (Celsius)) for 2 hours. The reaction solution was cooled to precipitate crystals. The crystals were recovered by filtration and washed with water and then methanol to give 1 g (yield: 60%) of xx-12.

(5) Synthesis of xx-13

[Chem. 14]

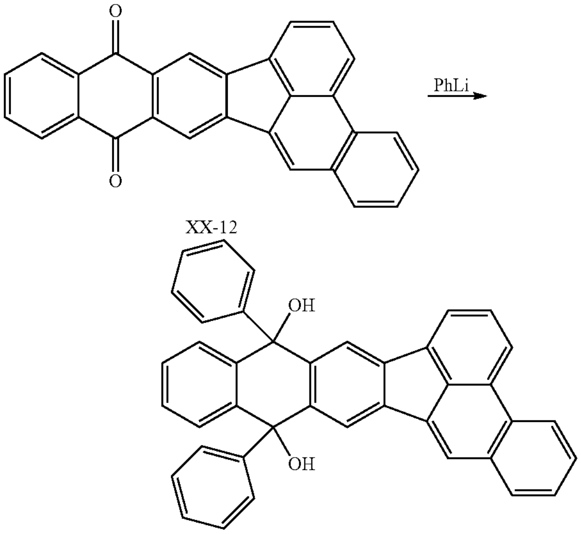

XX-12

XX-13

The reagent and a solvent described below were charged into a reaction vessel.

xx-12: 1 g (2.6 mmol)

THF: 50 mL

Argon was introduced into the reaction vessel, so that the reaction vessel containing the reaction system was filled with an argon atmosphere. The reaction solution was cooled to −78 degrees (Celsius) in a dry ice bath. After 4 mL of a phenyllithium solution (1.9 M) was added dropwise thereto, the reaction solution was stirred at room temperature for 2 hours. After the completion of the reaction, the reaction solution was poured into ice-cold water. Ethyl acetate was added thereto. The separation of two layers was performed to recover the organic layer. The organic layer was dried over sodium sulfate. Removal of the solvent under reduced pressure gave a crude product. The crude product was subjected to separation and purification by silica-gel chromatography (developing solvent: heptane/ethyl acetate=3/1). Recrystallization from toluene-ethanol gave 630 mg (yield: 45%) of xx-13.

(6) Synthesis of Exemplary Compound D1-25

[Chem. 15]

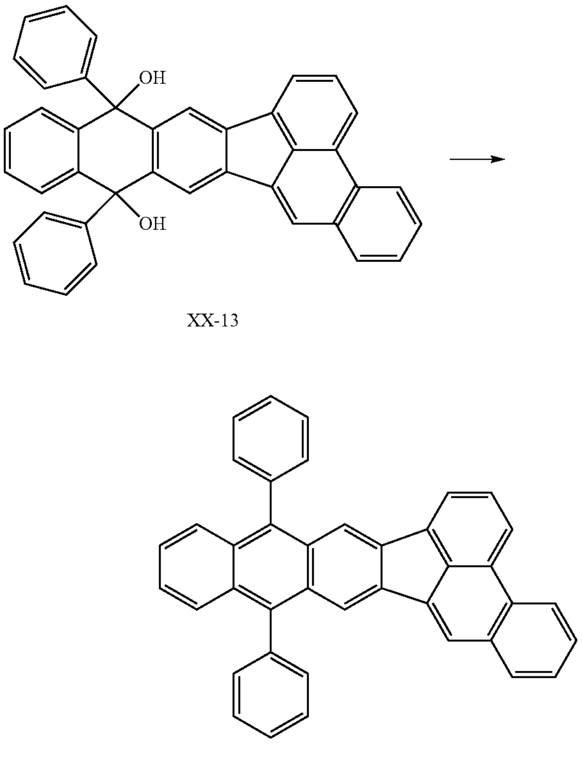

XX-13 exemplary compound D1-25

Reagents and a solvent described below were charged into a 50-mL reaction vessel.

xx-13: 0.5 g (0.9 mmol)

$NaH_2PO_2*H_2O$: 1.6 g (19 mmol)

Potassium iodide: 1.2 g (7.5 mmol)

Acetic acid: 50 mL

Argon was introduced into the reaction vessel, so that the reaction vessel containing the reaction system was filled with an argon atmosphere. The reaction solution was heated to 80 degrees (Celsius) and stirred at this temperature (80 degrees (Celsius)) for 12 hours. After the completion of the reaction, the reaction solution was poured into ice-cold water to precipitate crystals. The crystals were filtered to give a crude product. The crude product was subjected to separation and purification by silica-gel chromatography (developing solvent: heptane/toluene=6/1). Recrystallization from toluene-ethanol gave 61 mg (yield: 14%) of exemplary compound D1-25 as a yellow powder.

The structure of the compound was determined by mass spectrometry (MS) and nuclear magnetic resonance (NMR) spectroscopy. That is, a mass of 504, which is M+ of the compound, was observed by matrix-assisted laser desorption-ionization mass spectrometry (MALDI-MS). Furthermore, NMR results were described below.

$^1$H-NMR ($CDCl_3$, 400 MHz) delta (ppm): 8.64 (d, 1H), 8.45 (d, 1H), 8.28 (s, 1H), 8.16 (s, 1H), 8.11 (s, 1H) 7.95 (m, 2H), 7.75-7.55 (m, 14H), and 7.36-7.33 (m, 3H).

Compounds Used in Examples and Comparative Examples

Among materials used in Examples and Comparative Examples described below, materials used as hosts, first dopants, and second dopants are listed below.

[Chem. 16]

H-1

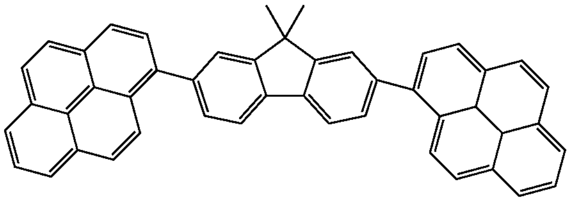

H-10

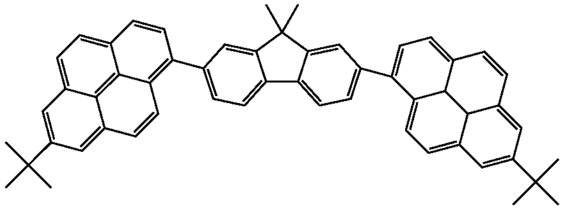

H-5

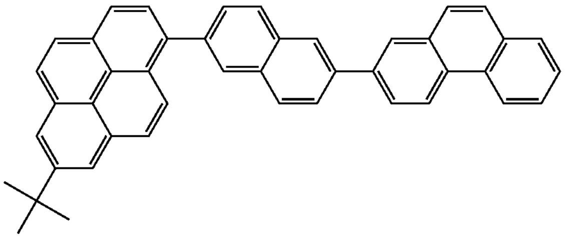

compound 3

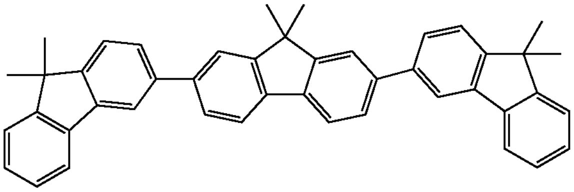

-continued

[Chem. 17]

D1-1

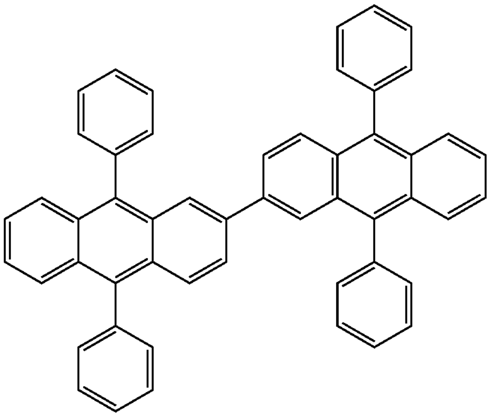

D1-10

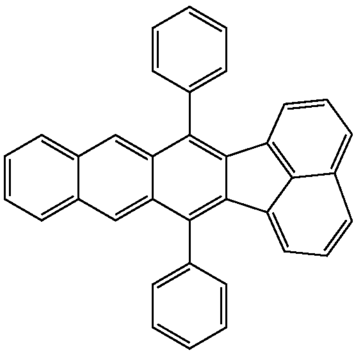

D1-20

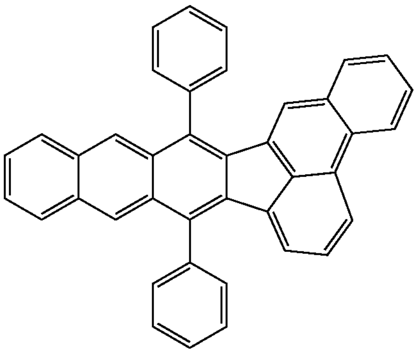

D1-25

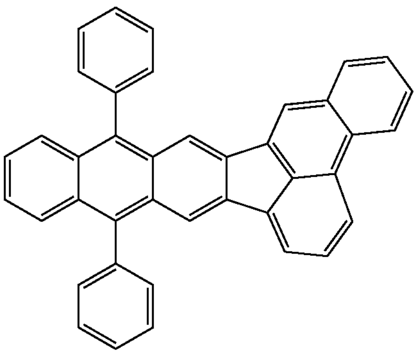

-continued

D1-41

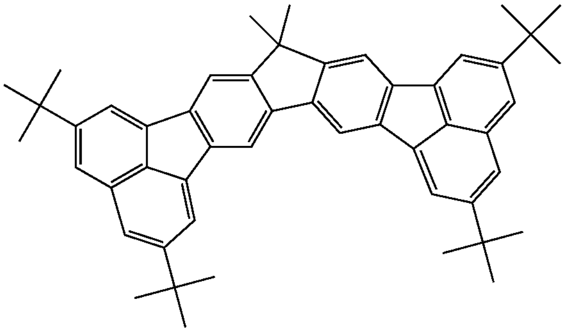

compound 1

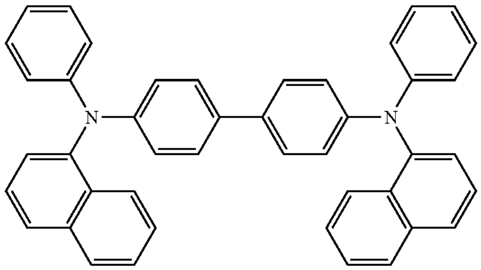

[Chem. 18]

D2-7

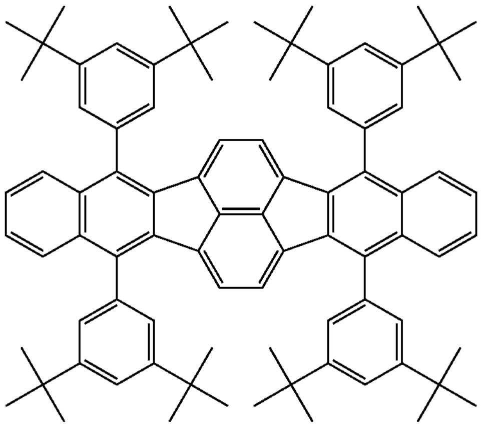

D2-15

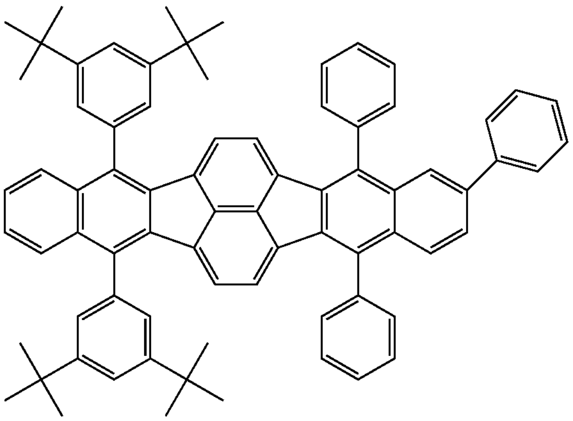

Table 1 shows the HOMO, the LUMO, the first maximum emission wavelength, and the second maximum emission wavelength of each of the hosts, the first dopants, and the second dopants.

The HOMO and the LUMO were evaluated by methods described below.

(i) HOMO

A thin film (thickness: 20 nm) was formed by vacuum evaporation. The thin film was evaluated by photoelectron spectroscopy using a photoelectron spectrometer (AC-2, manufactured by Riken Keiki Co., Ltd.) in air.

(ii) LUMO

A thin film (thickness: 20 nm) was formed by vacuum evaporation. The LUMO was determined on the basis of an energy gap calculated from the wavelength of a rising edge of an absorption curve in the ultraviolet-visible absorption spectrum of the thin film. The ultraviolet-visible absorption spectrum was measured with a spectrophotometer (U-3010, manufactured by Hitachi Ltd).

TABLE 1

| | | HOMO [eV] | LUMO [eV] | First maximum emission wavelength [nm] | Second maximum emission wavelength [nm] |
|---|---|---|---|---|---|
| Host | Exemplary compound H-1 | −5.8 | −2.8 | 442 | 471 |
| | Exemplary compound H-10 | −5.7 | −2.7 | 440 | 465 |
| | Exemplary compound H-5 | −5.7 | −2.7 | 436 | 470 |
| | Compound 3 | −5.9 | −2.7 | 410 | 450 |
| First dopant | Exemplary compound D1-1 | −5.7 | −2.9 | 465 | 495 |
| | Exemplary compound D1-10 | −5.6 | −3.0 | 472 | 503 |
| | Compound 1 | −5.3 | −2.4 | 420 | 438 |
| | Exemplary compound D1-20 | −5.6 | −3.0 | 472 | 508 |
| | Exemplary compound D1-25 | −5.6 | −3.0 | 470 | 502 |
| | Exemplary compound D1-41 | −5.6 | −2.9 | 500 | 513 |
| Second dopant | Exemplary compound D2-7 | −5.8 | −3.4 | 510 | 540 |
| | Exemplary compound D2-15 | −5.8 | −3.4 | 512 | 549 |

Example 1

An organic light-emitting device having a top-emission structure illustrated in FIG. 1D was produced by a method described below.

A film composed of an aluminum alloy (AlNd) was formed by sputtering on a glass substrate (substrate 1) serving as a support to form a bottom reflective electrode. The bottom reflective electrode had a thickness of 100 nm. An ITO film was formed by sputtering on the bottom reflective electrode to form a bottom transparent electrode. The bottom transparent electrode had a thickness of 80 nm. The bottom reflective electrode and the bottom transparent electrode function as the anode 2.

Next, an acrylic resin film was formed by spin coating on the anode 2 arranged on the substrate. At this point, the resin film had a thickness of 1.5 micrometers. The resin film was desirably patterned by photolithography in such a manner that a device isolation film was formed on the peripheral portion of the anode. At this time, an opening having a radius of 3 mm was formed. The substrate provided with the device isolation film was subjected to ultrasonic cleaning with acetone and then isopropyl alcohol (IPA). The substrate was boiled in IPA and dried. Surfaces of the substrate were subjected to UV/ozone cleaning.

Compound 1 described below was deposited by vacuum evaporation on the anode 2 to form the hole transport layer 5. At this point, the hole transport layer 5 had a thickness of 110 nm.

[Chem. 19]

compound 1

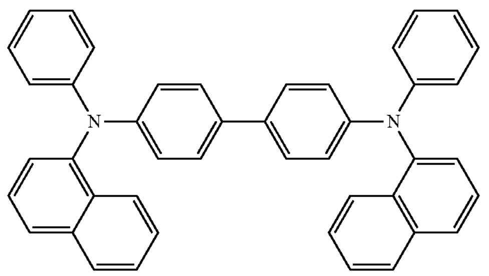

A host (H-1), a first dopant (D1-1), and a second dopant (D2-7) were co-deposited by vacuum evaporation on the hole transport layer 5 in a weight ratio of [H-1]:[D1-1]:[D2-7]=68:30:2 to form the light-emitting sublayer 3. The light-emitting sublayer 3 had a thickness of 20 nm.

Compound 2 described below was deposited by vacuum evaporation on the light-emitting sublayer 3 to form the electron transport layer 6. The electron transport layer 6 had a thickness of 20 nm.

[Chem. 20]

compound 2

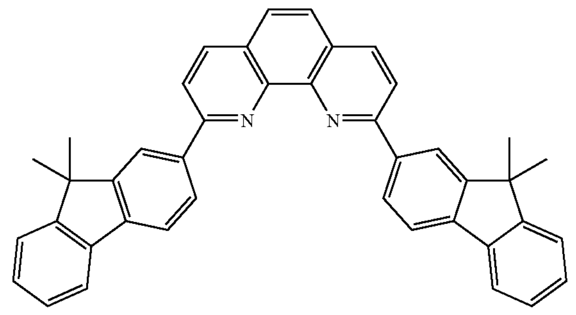

Compound 2 and cesium carbonate were co-deposited by vacuum evaporation on the electron transport layer 6 to form the electron injection layer 9 in such a manner that the electron injection layer 9 had a cesium concentration of 20% by weight. The electron injection layer 9 had a thickness of 60 nm.

ITO was deposited by sputtering on the electron injection layer 9 to form an upper transparent electrode (cathode 4). The upper transparent electrode had a thickness of 30 nm. The substrate 1 on which these layers including the cathode 4 had been formed was sealed with a glass cap provided with a drying agent in a glove box under a nitrogen atmosphere. Thereby, the organic light-emitting device 14 was produced.

With respect to the organic light-emitting device, the luminous efficiency and the voltage when a current was passed therethrough at a current density of 10 mA/cm$^2$ were evaluated. Furthermore, when a voltage was applied at a current density of 100 mA/cm$^2$, the time until the luminance was reduced to 90% (life time) was evaluated. Table 2 shows the results.

Example 2

An organic light-emitting device was produced as in Example 1, except that exemplary compound D1-10 was used as the first dopant in place of exemplary compound D1-1 and that the host (H-1), the first dopant (D1-10), and the second dopant (D2-7) were co-deposited in a weight ratio of [H-1]:[D1-10]:[D2-7]=82:15:2 to form the light-emitting sublayer 3.

The resulting organic light-emitting device was evaluated as in Example 1. Table 2 shows the results.

Example 3

An organic light-emitting device was produced as in Example 2, except that the host (H-1), the first dopant (D1-10), and the second dopant (D2-7) were co-deposited in a weight ratio of [H-1]:[D1-10]:[D2-7]=68:30:2 to form the light-emitting sublayer 3.

The resulting organic light-emitting device was evaluated as in Example 1. Table 2 shows the results.

Example 4

An organic light-emitting device was produced as in Example 2, except that the host (H-1), the first dopant (D1-10), and the second dopant (D2-7) were co-deposited in a weight ratio of [H-1]:[D1-10]:[D2-7]=58:40:2 to form the light-emitting sublayer 3.

The resulting organic light-emitting device was evaluated as in Example 1. Table 2 shows the results.

Comparative Example 1

An organic light-emitting device was produced as in Example 1, except that the first dopant (D1-1) was not used and that the host (H-1) and the second dopant (D2-7) were co-deposited in a weight ratio of [H-1]:[D2-7]=98:2 to form the light-emitting sublayer 3.

The resulting organic light-emitting device was evaluated as in Example 1. Table 2 shows the results.

Comparative Example 2

An organic light-emitting device was produced as in Example 2, except that the host (H-1), the first dopant (D1-10), and the second dopant (D2-7) were co-deposited in a weight ratio of [H-1]:[D1-10]:[D2-7]=48:50:2 to form the light-emitting sublayer 3.

The resulting organic light-emitting device was evaluated as in Example 1. Table 2 shows the results.

Comparative Example 3

An organic light-emitting device was produced as in Example 2, except that the host (H-1), the first dopant (D1-

10), and the second dopant (D2-7) were co-deposited in a weight ratio of [H-1]:[D1-10]:[D2-7]=28:70:2 to form the light-emitting sublayer 3.

The resulting organic light-emitting device was evaluated as in Example 1. Table 2 shows the results.

Comparative Example 4

An organic light-emitting device was produced as in Example 1, except that compound 1 in place of the first dopant (D1-1) was used for the light-emitting sublayer and that the host (H-1), the first dopant (compound 1), and the second dopant (D2-7) were co-deposited in a weight ratio of [H-1]:[compound 1]:[D2-7]=88:10:2 to form the light-emitting sublayer 3.

The resulting organic light-emitting device was evaluated as in Example 1. Table 2 shows the results.

Comparative Example 5

An organic light-emitting device was produced as in Comparative Example 4, except that the host (H-1), the first dopant (compound 1), and the second dopant (D2-7) were co-deposited in a weight ratio of [H-1]:[compound 1]:[D2-7]=68:30:2 to form the light-emitting sublayer 3.

The resulting organic light-emitting device was evaluated as in Example 1. Table 2 shows the results.

TABLE 2

| | Luminous efficiency [cd/A] | Voltage [V] | Life time [hr] |
|---|---|---|---|
| Example 1 | 21 | 4.9 | 800 |
| Example 2 | 21 | 5.0 | 1100 |
| Example 3 | 23 | 4.8 | 1100 |
| Example 4 | 23 | 4.8 | 600 |
| Comparative Example 1 | 19 | 5.2 | 350 |
| Comparative Example 2 | 22 | 4.8 | 350 |
| Comparative Example 3 | 23 | 4.7 | 200 |
| Comparative Example 4 | 14 | 5.3 | 150 |
| Comparative Example 5 | 16 | 3.6 | 100 |

A comparison between Examples (Examples 1 to 4) and Comparative Example 1 shown in Table 2 demonstrates that the efficiency, the voltage, and the life time are improved. The emission spectra of the organic light-emitting devices produced in Examples (Examples 1 to 4) are substantially the same as the emission spectrum of the organic light-emitting device produced in Comparative Example 1. However, the emission from the host and the first dopant, which have the first maximum emission wavelength shorter than that of the second dopant, were not observed in the emission spectra of the organic light-emitting devices produced in Examples. It is thus speculated that in Examples, energy transfer from the first dopant to the second dopant occurs easily, so that the significant effect of the present invention is provided. A comparison between Comparative Example 1 and Comparative Examples 2 and 3 showed that the organic light-emitting devices produced in Comparative Examples 2 and 3 had better efficiencies and voltages but had shorter life times. The reason for this may be that since the main component in the light-emitting sublayer is the first dopant, electron conduction occurs using the first dopant, thus not resulting in the effect of the present invention. A comparison between Comparative Example 1 and Comparative Examples 4 and 5 showed that the driving voltage was reduced in Comparative Example 5 but that the efficiency and the life time were not improved. The reason for this may be that the use of compound 1 as the first dopant does not satisfy the requirements (a) and (b), so that electrons injected into the light-emitting sublayer are accumulated only in the second dopant. Furthermore, the presence of nitrogen atoms in compound 1 can cause the formation of a charge-transfer complex and quenching due to electrons accumulated in the second dopant, thereby leading to reductions in luminous efficiency and lifetime.

Example 5

An organic light-emitting device was produced as in Example 3, except that exemplary compound H-10 in place of exemplary compound H-1 was used as the host.

The resulting organic light-emitting device was evaluated as in Example 1. Table 3 shows the results.

Comparative Example 6

An organic light-emitting device was produced as in Example 5, except that the first dopant (D1-10) was not used in forming the light-emitting sublayer and that the host (H-10) and the second dopant (D2-2) were co-deposited in a weight ratio of [H-10]:[D2-7]=98:2 to form the light-emitting sublayer 3.

The resulting organic light-emitting device was evaluated as in Example 1. Table 3 shows the results.

TABLE 3

| | Luminous efficiency [cd/A] | Voltage [V] | Life time [hr] |
|---|---|---|---|
| Example 5 | 20 | 4.8 | 1000 |
| Comparative Example 6 | 18 | 5.1 | 300 |

A comparison between Example 5 and Comparative Example 6 shown in Table 3 demonstrates that the efficiency, the voltage, and the life time are improved. Furthermore, no emission attributed to the host and the first dopant was observed.

Example 6

An organic light-emitting device was produced as in Example 1, except that exemplary compound D1-20 in place of exemplary compound D1-1 was used as the first dopant and that exemplary compound D2-15 in place of exemplary compound D2-7 was used as the second dopant.

The resulting organic light-emitting device was evaluated as in Example 1. Table 4 shows the results.

Example 7

An organic light-emitting device was produced as in Example 6, except that exemplary compound H-5 in place of exemplary compound H-1 was used as the host.

The resulting organic light-emitting device was evaluated as in Example 1. Table 4 shows the results.

Comparative Example 7

An organic light-emitting device was produced as in Example 6, except that compound 3 in place of exemplary compound H-1 was used as the host.

The resulting organic light-emitting device was evaluated as in Example 1. Table 4 shows the results.

TABLE 4

| | Luminous efficiency [cd/A] | Voltage [V] | Life time [hr] |
|---|---|---|---|
| Example 6 | 21 | 4.4 | 1100 |
| Example 7 | 20 | 4.3 | 1000 |
| Comparative Example 7 | 12 | 5.3 | 200 |

In Example 6, the efficiency, the voltage, and the life time were improved compared with Comparative Example 1. In Comparative Example 7, the efficiency, the voltage, and the life time were not improved compared with the case where the first dopant was not used. The efficiency, the voltage, and the life time were impaired compared with those in Examples 6 and 7. In Examples 6 and 7 and Comparative Example 7, no emission from the host and the first dopant was observed, and only an emission spectrum attributed to the second dopant was observed.

Example 8

An organic light-emitting device having a top-emission structure illustrated in FIG. 1F was produced by a method described below. The anode 2 and a device isolation film were formed on the substrate 1 as in Example 1. Next, a hole transport layer was formed on the anode 2 as in Example 1. The host (H-1), a first dopant (D1-25), and a second dopant (D2-15) were co-deposited by vacuum evaporation on the hole transport layer 5 in a weight ratio of [H-1]:[D1-25]:[D2-15]=68:30:2 to form the light-emitting sublayer 3. The light-emitting sublayer 3 had a thickness of 20 nm. Compound 4 described below was deposited by vacuum evaporation on the light-emitting sublayer 3 to form the hole/exciton blocking layer 8. The hole/exciton blocking layer 8 had a thickness of 10 nm.

[Chem. 21]

compound 4

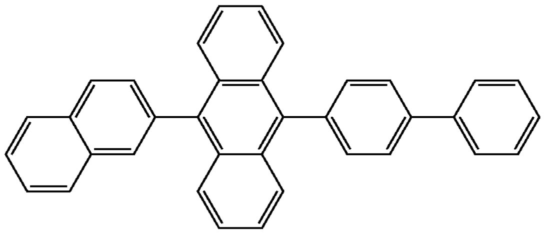

Compound 2 was deposited by vacuum evaporation on the hole/exciton blocking layer 8 to form the hole injection layer 7. The hole injection layer 7 had a thickness of 10 nm. The electron injection layer 9 and a cathode were formed as in Example 1. Thereby, the organic light-emitting device was produced. The resulting organic light-emitting device was evaluated as in Example 1. Table 5 shows the results.

Example 9

An organic light-emitting device was produced as in Example 8, except that exemplary compound D1-41 in place of exemplary compound D1-25 was used as the first dopant. The resulting organic light-emitting device was evaluated as in Example 1. Table 5 shows the results.

Example 10

An organic light-emitting device having a top-emission structure illustrated in FIG. 1G was produced by a method described below. The anode 2 and a device isolation film were formed on the substrate 1 as in Example 1. Compound 1 was deposited by vacuum evaporation on the anode 2 to form the hole injection layer 7. The hole injection layer 7 had a thickness of 100 nm. Compound 5 described below was deposited by vacuum evaporation on the hole injection layer 7 to form the hole transport layer 5. The hole transport layer 5 had a thickness of 10 nm.

[Chem. 22]

compound 5

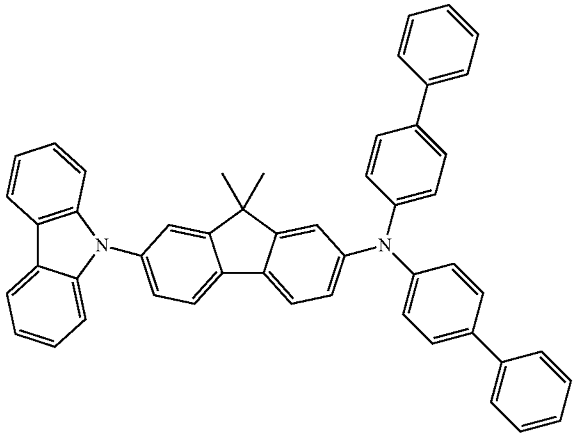

The light-emitting sublayer 3, the electron transport layer 6, the electron injection layer 9, and the cathode 4 were formed as in Example 1. Thereby, the organic light-emitting device was produced. The resulting organic light-emitting device was evaluated as in Example 1. Table 5 shows the results.

Comparative Example 8

An organic light-emitting device was produced as in Example 8, except that the first dopant was not used and that the host (H-1) and the second dopant (D2-15) were co-deposited in a weight ratio of [H-1]:[D2-15]=98:2 to form the light-emitting sublayer 3. The resulting organic light-emitting device was evaluated as in Example 1. Table 5 shows the results.

Comparative Example 9

An organic light-emitting device was produced as in Example 10, except that the first dopant was not used and that the host (H-1) and the second dopant (D2-15) were co-deposited in a weight ratio of [H-1]:[D2-15]=98:2 to form the light-emitting sublayer 3. The resulting organic light-emitting device was evaluated as in Example 1. Table 5 shows the results.

TABLE 5

| | Luminous efficiency [cd/A] | Voltage [V] | Life time [hr] |
|---|---|---|---|
| Example 8 | 23 | 4.4 | 1200 |
| Example 9 | 20 | 5.0 | 200 |
| Example 10 | 25 | 4.7 | 1100 |
| Comparative Example 8 | 19 | 5.3 | 200 |
| Comparative Example 9 | 21 | 5.2 | 150 |

A comparison between Examples (Examples 8 and 9) and Comparative Example 8 shown in Table 5 demonstrates that the efficiency, the voltage, and the life time in Examples were improved. Furthermore, no emission attributed to the host and the first dopant was observed. A comparison between Example 10 and Comparative Example 9 shown in Table 5 demonstrates that the efficiency, the voltage, and the life time in Examples were improved. Furthermore, no emission attributed to the host and the first dopant was observed.

With respect to Examples 1, 3, and 5 to 9 and Comparative Examples 5 and 7, the organic light-emitting devices were evaluated for whether the relationships (a), (b), and (c), which are requirements of the present invention, held or not and whether the effect of the present invention was provided or not. Table 6 shows the results. Specifically, evaluation criteria were as follows:

With respect to the first maximum emission wavelength,
Satisfied: the relationship (a) held, and
Unsatisfied: the relationship (a) did not hold.
With respect to the LUMO,
satisfied: the relationship (b) held; and
unsatisfied: the relationship (b) did not hold.
With respect to the HOMO,
satisfied: the relationship (c) held; and
unsatisfied: the relationship (c) did not hold.
With respect to the effect,
improved: all of the efficiency, the voltage, and the life time were improved compared with those of the organic light-emitting devices that did not contain the first dopant; and unimproved: at least one of the efficiency, the voltage, and the life time was not improved compared with those of the organic light-emitting devices that did not contain the first dopant.

TABLE 6

| | (a) | (b) | (c) | Effect |
|---|---|---|---|---|
| Example 1 | Satisfied | Satisfied | Satisfied | Improved |
| Example 3 | Satisfied | Satisfied | Satisfied | Improved |
| Example 5 | Satisfied | Satisfied | Satisfied | Improved |
| Example 6 | Satisfied | Satisfied | Satisfied | Improved |
| Example 7 | Satisfied | Satisfied | Satisfied | Improved |
| Example 8 | Satisfied | Satisfied | Satisfied | Improved |
| Example 9 | Satisfied | Satisfied | Satisfied | Improved |
| Comparative Example 5 | Unsatisfied | Unsatisfied | Satisfied | Unimproved |
| Comparative Example 7 | Satisfied | Satisfied | Unsatisfied | Unimproved |

With respect to Examples 1, 3, and 5 to 9, the organic light-emitting devices were evaluated for whether the relationships (d) and (e) held or not. Table 7 shows the results. Table 7 shows the value of |second maximum emission wavelength (H)−first maximum emission wavelength (D1)|, the value of |second maximum emission wavelength (D1)−first maximum emission wavelength (D2)|, and the life time in each of Examples.

TABLE 7

| | \|Second maximum emission wavelength (H) − first maximum emission wavelength (D1)\| | \|Second maximum emission wavelength (D1) − first maximum emission wavelength (D2)\| | Life time [hour] |
|---|---|---|---|
| Example 1 | 6 nm | 15 nm | 800 |
| Example 3 | 1 nm | 7 nm | 1100 |
| Example 5 | 7 nm | 7 nm | 1000 |
| Example 6 | 1 nm | 4 nm | 1100 |
| Example 7 | 2 nm | 4 nm | 1000 |
| Example 8 | 1 nm | 7 nm | 1200 |
| Example 9 | 29 nm | 2 nm | 500 |

From the results shown in Table 7, in the case where arrays of the organic light-emitting devices produced in Examples 1, 3, and 5 to 9 are used for displays, the following points are found. Assuming that the initial luminance is set to 1000 cd/m$^2$, the life times are roughly estimated at 77,000 hours, 120,000 hours, 89,000 hours, 110,000 hours, 89,000 hours, 130,000 hours, and 45,000 hours. Here, in the case where each of the arrays is used as a display, a 10% or more reduction in the luminance of the light-emitting portion causes problems such as color misregistration. To achieve practical use, the length of time the luminance is reduced by 10% may be 80,000 hours or more. From Table 7, the first dopant, the host, and the second dopant used in each of Examples 3 and 5 to 8 satisfy the following relationships (d) and (e)

(d) |second maximum emission wavelength (H)−first maximum emission wavelength (D1)| is equal to or less than 7 nm, and (e) |second maximum emission wavelength (D1)−first maximum emission wavelength (D2)| is equal to or less than 7 nm.

It is thus speculated that energy transfer from the host to the first dopant and energy transfer from the first dopant to the second dopant occur easily, so that the significant effect of the present invention is provided compared with the Example 1. Accordingly, the organic light-emitting devices that satisfy the relationships (d) and (e) are more practical.

Example 11

A display illustrated in FIG. 3 was produced by a method described below. TFT driver circuits 21, which were composed of low-temperature polysilicon and needed to drive organic light-emitting devices and a planarized film 22 were formed, in that order, on the substrate 1. The anodes 2 and pixel separation films 25 were formed at desired positions on the planarized film 22. Here, for example, the TFT driver circuits were two-dimensionally arranged for pixels ((640×3 colors)×480) that measure 3.5 inches diagonally. In the display 20 illustrated in FIG. 3, for example, each of the anodes 2 was formed of a laminated electrode film in which a reflective film 23 formed of a 50-nm-thick Ag alloy thin film was stacked on a transparent electrode 24 formed of a 60-nm-thick ITO thin film. The anodes 2 arranged in the pixels were connected to the TFT driver circuits 21 through contact holes (not illustrated) formed in the planarized film 22. The pixel separation films 25 composed of a polyimide resin were formed between the pixels.

The substrate 1 was subjected to ultrasonic cleaning with acetone and then isopropyl alcohol (IPA). The substrate 1 was boiled in IPA and dried. Surfaces of the substrate 1 were subjected to UV/ozone cleaning. The treated substrate 1 was placed in a vacuum chamber. Organic compound layers and a cathode were formed as described below, thereby producing a display including a plurality of organic light-emitting devices each emitting light of one of the three colors (red (R), green (G), and blue (B)).

Compound 1 was deposited by vacuum evaporation to form the hole injection layers 7 common to all the pixels. Each of the hole injection layers 7 had a thickness of 60 nm. Compound 5 was selectively deposited in regions corresponding to blue pixels with a shadow mask, forming the hole transport layers 5. Each of the hole injection layers had a thickness of 10 nm. Compound 6 and compound 7 described below were co-deposited in a weight ratio of [compound 6]:[compound 7]=95:5 to form blue-light-emitting layers 31. Each of the blue-light-emitting layers 31 had a thickness of 35 nm.

[Chem. 23]

compound 6

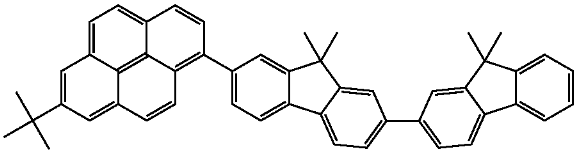

-continued compound 7

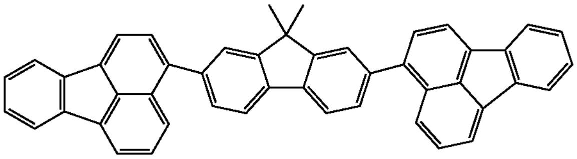

Compound 1 was selectively deposited in regions corresponding to green pixels with a shadow mask to adjust the thickness of the hole injection layer 7. The thin film selectively deposited in the regions corresponding to the green pixels had a thickness of 50 nm. The host (H1-1), the first dopant (D1-25), and the second dopant (D2-15) were co-deposited in a weight ratio of [H-1]:[D1-25]:[D2-15]=68:30:2 to form green-light-emitting layers 32. Each of the green-light-emitting layers 32 had a thickness of 20 nm.

Compound 1 was selectively deposited in regions corresponding to red pixels with a shadow mask to adjust the thickness of the hole injection layer 7. The thin film selectively deposited in the regions corresponding to the red pixels had a thickness of 120 nm. Compound 8 and compound 9 described below were co-deposited in a weight ratio of [compound 8]:[compound 9]=90:10 to form red-light-emitting layers 33. Each of the red-light-emitting layers 33 had a thickness of 30 nm.

[Chem. 24]

compound 8

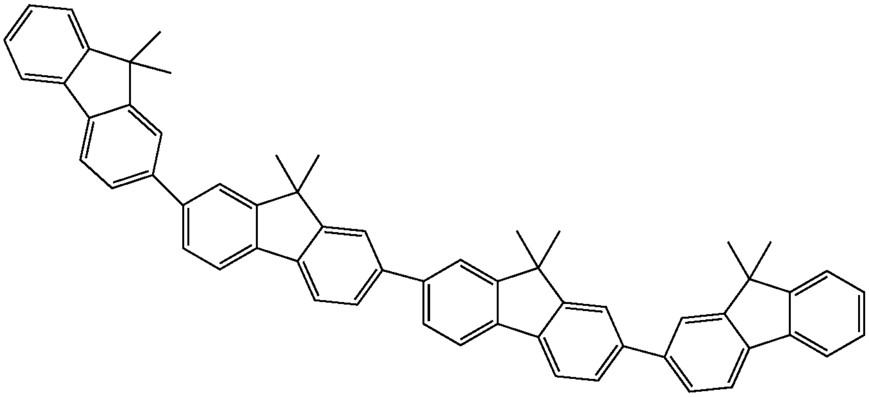

compound 9

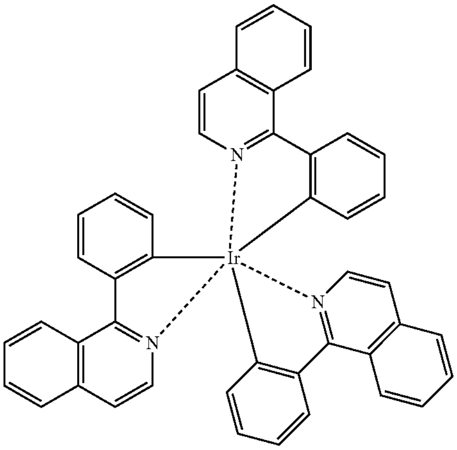

Compound 2 was deposited by vacuum evaporation to form the electron transport layers 6 common to all the pixels. Each of the electron transport layers 6 had a thickness of 20 nm. Compound 3 and cesium carbonate were co-deposited by vacuum evaporation on the electron transport layers 6 to form the electron injection layers 9 in such a manner that the electron injection layer 9 had a cesium concentration of 20% by weight. Each of the electron injection layers 9 had a thickness of 60 nm. ITO was deposited by sputtering on the electron injection layers 9 to form an upper transparent electrode (cathode 4). The upper transparent electrode had a thickness of 30 nm.

The substrate on which the organic light-emitting devices had been formed was sealed with a glass cap provided with a drying agent in a glove box under a nitrogen atmosphere. A circularly polarizing plate 28 was arranged on the glass cap for the purpose of preventing the reflection of external light. Thereby, the display was produced.

When the resulting display was driven, a high-luminance, crisp, full-color movie display was obtained with high durability. Furthermore, the resulting display was effectively usable as a display for use in, for example, mobile equipment with limited power source capacity also from the viewpoint of power consumption.

In conclusion, the organic light-emitting device according to aspects of the present invention has a long lifetime.

As the present invention has been illustrated by the embodiments and examples, according to aspects of the present invention, it is possible to provide a low-voltage, high-efficiency organic light-emitting device with a long lifetime under continuous operation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-219063, filed Sep. 24, 2009, which is hereby incorporated by reference herein in its entirety.

The invention claimed is:

1. An organic light-emitting device comprising:

an anode;

a cathode; and an organic compound layer including at least a light emitting sublayer and being arranged between the anode and the cathode, the light emitting sublayer containing a host serving as a main component, a first dopant, and a second dopant, the organic light-emitting device satisfying the following relationships (1) and (2):

(1) LUMO (H) >LUMO (D2), and (2) HOMO (H) is equal to or higher than HOMO (D2), (where LUMO (H) represents the LUMO of the host, LUMO (D2) represents the LUMO of the second dopant, HOMO (H) represents the HOMO of the host, and HOMO (D2) represents the HOMO of the second dopant), wherein for the host, the first dopant, and the second dopant, the following relationships (a) to (c) hold, whereby only the second dopant emits light:

(a) first maximum emission wavelength (H) <first maximum emission wavelength (D1) <first maximum emission wavelength (D2), (b) LUMO (D2) <LUMO (D1) <LUMO (H), and (c) HOMO (D2) is equal to or lower than HOMO (H) <HOMO (D1) (where in the relationship (a), the first maximum emission wavelength (H) indicates the first maximum emission wavelength of the host, the first maximum emission wavelength (D1) indicates the first maximum emission wavelength of the first dopant, and the first maximum emission wavelength (D2) indicates the first maximum emission wavelength of the second dopant; in the relationship (b), LUMO (H) represents the LUMO of the host, LUMO (D1) represents the LUMO of the first dopant, and LUMO (D2) represents the LUMO of the second dopant; and in the relationship (c), HOMO (H) and HOMO(D2) are as defined above, and HOMO (D1) represents the HOMO of the first dopant).

2. The organic light-emitting device according to claim 1, wherein each of the host, the first dopant, and the second dopant consists of only a hydrocarbon.

3. The organic light-emitting device according to claim 1, wherein the light-emitting sublayer has a first dopant content of 10% to 35% by weight.

4. The organic light-emitting device according to claim 1, wherein the following relationships (d) and (e) hold:

(d) Isecond maximum emission wavelength (H)-first maximum emission wavelength (D1)I is equal to or less than 7 nm, and (e) Isecond maximum emission wavelength (D1)-first maximum emission wavelength (D2)I is equal to or less than 7 nm, (where in the relationship (d), the second maximum emission wavelength (H) indicates the second maximum emission wavelength of the host; and in the relationship (e), the second maximum emission wavelength (D1) indicates the second maximum emission wavelength of the first dopant).

5. An apparatus comprising:

the organic light-emitting device according to claim 1; and a color filter.

6. An image forming apparatus using an electrographic method, the image forming apparatus comprising the organic light-emitting device according to claim 1 as an exposing light source.

7. A display comprising the organic light-emitting device according to claim 1 in a display portion.

8. A lighting device comprising the organic light-emitting device according to claim 1.

* * * * *